US012751222B2

(12) United States Patent
Kim et al.

(10) Patent No.: US 12,751,222 B2
(45) Date of Patent: Sep. 29, 2026

(54) METHOD FOR FABRICATING SEMICONDUCTOR DEVICE

(71) Applicant: Samsung Electronics Co., Ltd., Suwon-si (KR)

(72) Inventors: John Soo Kim, Suwon-si (KR); Gwan Ho Kim, Suwon-si (KR); Ji Yoon Kim, Suwon-si (KR); Heung Sik Park, Suwon-si (KR); Keun Hee Bai, Suwon-si (KR); Jong Min Baek, Suwon-si (KR); Do Haing Lee, Suwon-si (KR); Jong Sun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 408 days.

(21) Appl. No.: 18/476,390

(22) Filed: Sep. 28, 2023

(65) Prior Publication Data

US 2024/0355637 A1 Oct. 24, 2024

(30) Foreign Application Priority Data

Apr. 20, 2023 (KR) ........................ 10-2023-0052031

(51) Int. Cl.

| | |
|---|---|
| ***H10P 14/61*** | (2026.01) |
| ***H10P 14/60*** | (2026.01) |
| ***H10P 50/24*** | (2026.01) |
| ***H10P 76/20*** | (2026.01) |
| ***H10P 76/40*** | (2026.01) |
| ***H10W 20/00*** | (2026.01) |

(52) U.S. Cl.

CPC .......... *H10P 14/61* (2026.01); *H10P 14/6339* (2026.01); *H10P 50/242* (2026.01); *H10P 76/20* (2026.01); *H10P 76/405* (2026.01); *H10P 76/4085* (2026.01); *H10W 20/076* (2026.01)

(58) Field of Classification Search

CPC . H01L 21/32; H01L 21/0228; H01L 21/0271; H01L 21/0332; H01L 21/0337; H01L 21/3065; H01L 21/76831; H01L 21/31144; H01L 21/76816; H10P 14/61; H10P 14/6339; H10P 50/242; H10P 76/20; H10P 76/405; H10P 76/4085; H10P 50/73; H10W 20/076; H10W 20/089

See application file for complete search history.

(56) References Cited

U.S. PATENT DOCUMENTS

| | | | |
|---|---|---|---|
| 10,049,920 B1 | 8/2018 | Anderson et al. | |
| 10,192,780 B1 | 1/2019 | Wang et al. | |

(Continued)

FOREIGN PATENT DOCUMENTS

| | | |
|---|---|---|
| KR | 940002941 A | 2/1994 |

*Primary Examiner* — Marlon T Fletcher
*Assistant Examiner* — Christina A Sylvia
(74) *Attorney, Agent, or Firm* — Wolf, Greenfield & Sacks, P.C.

(57) ABSTRACT

A for fabricating a semiconductor device comprises forming a mask layer on a substrate, the mask layer defining a through hole that exposes an upper surface of the substrate, the mask layer comprising a first mask layer and a second mask layer, wherein the second mask layer is between the substrate and the first mask layer, and wherein the second mask layer comprises carbon. The method includes forming a liner layer on side walls of the through hole inside the second mask layer.

20 Claims, 30 Drawing Sheets

(56) References Cited

U.S. PATENT DOCUMENTS

| | | | | |
|---|---|---|---|---|
| 10,236,256 | B2 | 3/2019 | Zhang et al. | |
| 10,504,840 | B2 | 12/2019 | Xu | |
| 10,685,874 | B1 | 6/2020 | Xie et al. | |
| 10,957,583 | B2 | 3/2021 | Burns et al. | |
| 2015/0200109 | A1* | 7/2015 | Kong | H01L 21/32139 118/723 R |
| 2021/0066123 | A1* | 3/2021 | Hwang | H01L 21/76831 |

* cited by examiner

METHOD FOR FABRICATING SEMICONDUCTOR DEVICE

CROSS-REFERENCE TO RELATED APPLICATION

This application claims priority from Korean Patent Application No. 10-2023-0052031 filed on Apr. 20, 2023 in the Korean Intellectual Property Office, and all the benefits accruing therefrom under 35 U.S.C. 119, the contents of which in its entirety are herein incorporated by reference.

TECHNICAL FIELD

The present disclosure relates to a method for fabricating a semiconductor device, and more particularly, to a method for fabricating a semiconductor device including a wiring line formed in a BEOL (Back-End-Of-Line) process.

BACKGROUND

Rapid progress of down-scaling of semiconductor elements due to the development of electronic technology, higher integration and lower power consumption of semiconductor chips may be desired. To achieve higher integration and lower power consumption of semiconductor chips, a feature size of a semiconductor device may be decreased.

SUMMARY

Aspects of the present disclosure provide a method for fabricating a semiconductor device that may improve element performance and reliability by forming a cutting pattern that separates wiring lines from each other.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means illustrated in the claims and combinations thereof.

According to some embodiments of the present disclosure, a method for fabricating a semiconductor device comprises forming a mask layer on a substrate, the mask layer defining a through hole that exposes an upper surface of the substrate, the mask layer comprising a first mask layer and a second mask layer, wherein the second mask layer is between the substrate and the first mask layer, and wherein the second mask layer comprises carbon. The method includes forming a liner layer on side walls of the through hole inside the second mask layer.

According to some embodiments of the present disclosure, a method for fabricating a semiconductor device includes forming a pair of line patterns on an insulating film, wherein the pair of line patterns extend in a first direction, forming a mask layer that defines a through hole that exposes an upper surface of the insulating film, wherein the through hole is between the pair of line patterns in a second direction, forming a liner layer on a first portion of side walls of the through hole, and forming a blocking pattern in the through hole and on the liner layer. r.

According to some embodiments of the present disclosure, a method for fabricating a semiconductor device includes forming a second insulating film on a first insulating film that comprises a wiring pattern, forming a plurality of line patterns on the second insulating film, wherein the plurality of line patterns extend in a first direction, forming a first mask layer on the second insulating film and the line patterns, wherein the first mask layer comprises carbon, forming a second mask layer on the first mask layer, forming a photoresist pattern on the second mask layer, wherein the photoresist pattern defines an opening, forming a through hole within the first mask layer and the second mask layer, using the photoresist pattern as an etching mask, wherein the through hole exposes the second insulating film, forming a liner layer on a first mask layer and not on the second mask layer, and forming a blocking pattern on the liner layer to at least partially fill the through hole.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION OF THE EMBODIMENTS

Figure 1:
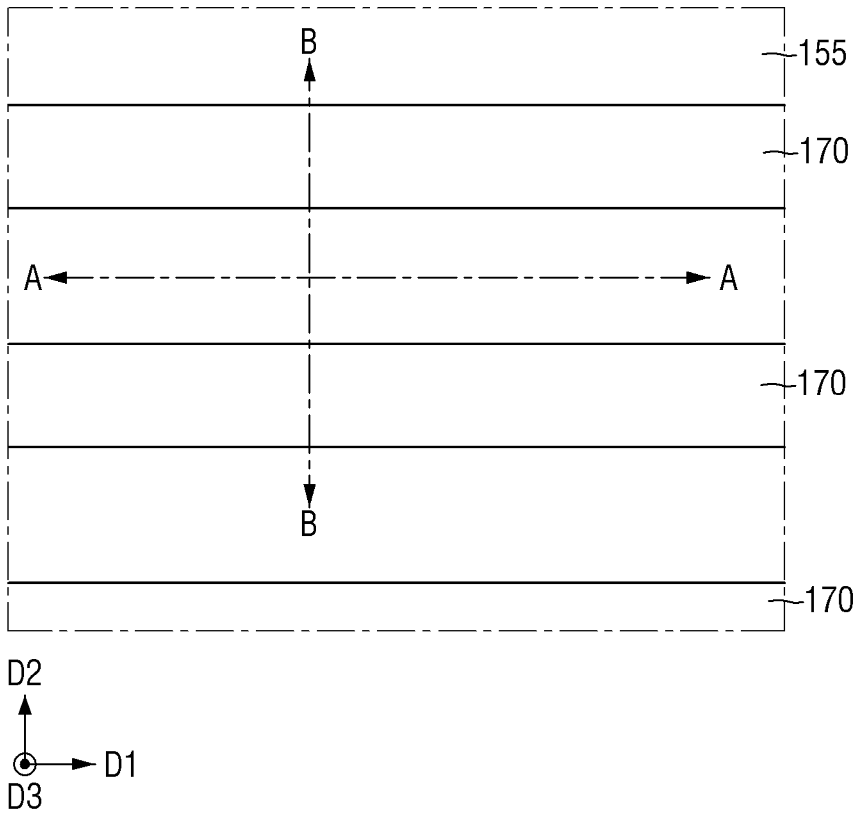
FIGS. 1, 2, 3, 4, 5, 6, 7, 8, 9, 10, 11, 12, 13, 14, 15, 16, 17, and 18 are diagrams illustrating a method for fabricating the semiconductor device according to some embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. As used herein, "an element A is at a same level as element B" refers to at least one surface of element A that is coplanar with at least one surface of element B. The term "connected" may be used herein to refer to a physical and/or electrical connection and may refer to a direct or indirect physical and/or electrical connection.

Although the semiconductor device described herein illustrates a fin-shaped transistor (FinFET) including a channel region of a fin-shaped pattern shape, a transistor including a nanowire or a nanosheet, and a MBCFET™ (Multi-Bridge Channel Field Effect Transistor) or a vertical transistor (Vertical FET), the present disclosure is not limited thereto. The semiconductor device according to some embodiments may include a tunneling transistor (tunneling FET) or a three-dimensional (3D) transistor. The semiconductor device according to some embodiments may include a planar transistor. In addition, the semiconductor device of the present disclosure may be a transistor having a two-dimensional material (2D material based FETs) and a heterostructure thereof.

Further, the semiconductor device described herein may also include a bipolar junction transistor, a laterally diffused metal oxide semiconductor (LDMOS), or the like.

FIGS. 1 to 18 are step diagrams illustrating a method for fabricating a semiconductor device according to some embodiments. FIGS. 1 and 14 are example plan views for explaining the method for fabricating the semiconductor device according to some embodiments. FIGS. 2, 4, 6, 8, 10, 12, 15, 17 and 18 are cross-sectional views taken along line A-A of FIG. 1. FIGS. 3, 5, 7, 9, 11, 13 and 16 are cross-sectional views taken along line B-B of FIG. 1.

Figure 2:
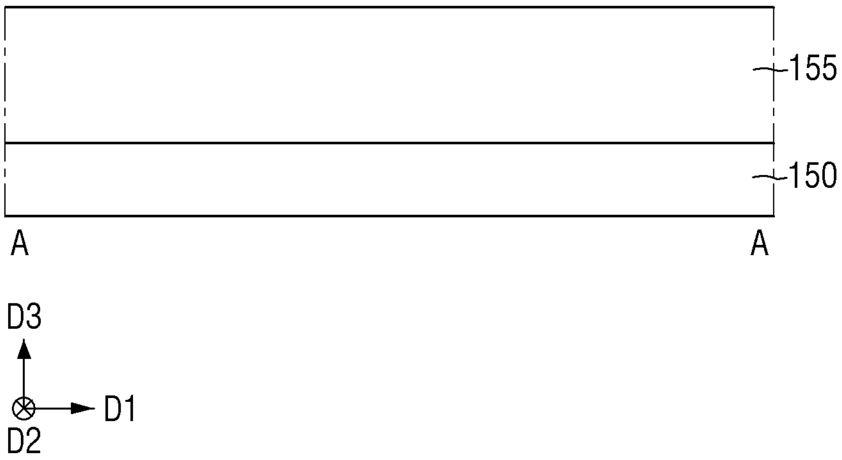
Figure 3:
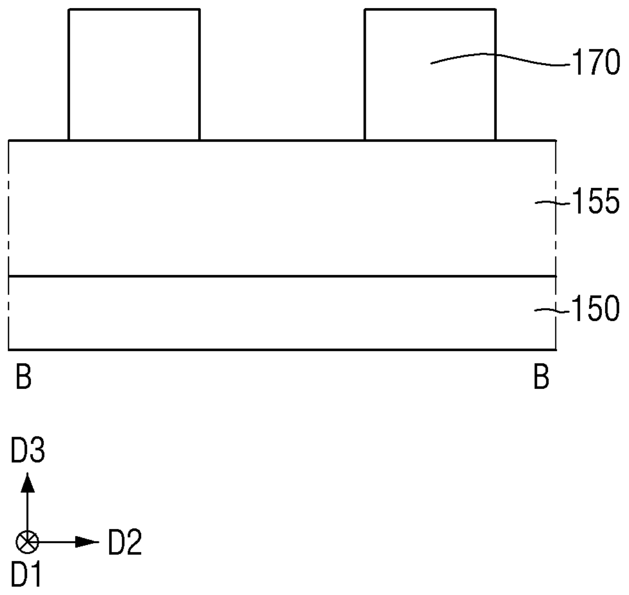

Referring to FIGS. 1 to 3, in the method for fabricating a semiconductor device 1000 according to some embodiments, a second insulating film 155 and a line pattern 170 may be sequentially formed on a first insulating film 150.

Although not shown, the first insulating film 150 may be on and/or cover a gate electrode and a source/drain of a transistor formed in a front-end-of-line (FEOL) process. Alternatively, the first insulating film 150 may be an interlayer insulating film formed in a back-end-of-line (BEOL) process.

The first insulating film 150 may include, for example, at least one of silicon oxide, silicon nitride, silicon oxynitride, and a low dielectric constant material. The low dielectric constant material may be, for example, silicon oxide having moderately high carbon and hydrogen, and may be a material such as SiCOH. On the other hand, since carbon is included in the insulating material, the dielectric constant of the insulating material may decrease. However, to further reduce the dielectric constant of the insulating material, the insulating material may include a pore, such as a cavity filled with gas or air inside the insulating material.

The low dielectric constant material may include, for example, but is not limited to, fluorinated tetraethylorthosilicate (FTEOS), hydrogen silsesquioxane (HSQ), Bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica or combinations thereof.

A second insulating film 155 may be formed on the first insulating film 150. The second insulating film 155 may include the same material as the first insulating film 150. In one variation, a boundary between the first insulating film 150 and the second insulating film 155 may not be distinguished (i.e., the second insulating film 155 and the first insulating film 150 are monolithic).

Each of the first insulating film 150 and the second insulating film 155 may be formed by, for example, chemical vapor deposition, spin coating, plasma enhanced CVD (PECVD), High Density Plasma CVD (HDP-CVD), or the like.

In the method for fabricating the semiconductor device according to some embodiments, the first insulating film 150 and the second insulating film 155 may be formed by the same process.

In the method for fabricating the semiconductor device according to some embodiments, each of the first insulating film 150 and the second insulating film 155 may be referred to as "a substrate." The substrate may include a metal wiring, a transistor, a diode, or the like, therein. The substrate may be a silicon substrate, a gallium arsenide substrate, a silicon germanium substrate, a ceramic substrate, a quartz substrate, a display glass substrate, or the like, or may be a semiconductor on insulator (SOI) substrate.

A line pattern 170 may be formed on the second insulating film 155. The line pattern 170 may extend in the second direction D2. The line patterns 170 may be spaced apart in a first direction D1. The line pattern 170 may be used as a mask pattern for etching the second insulating film 155 in a subsequent process.

The line pattern 170 may include, for example, but is not limited to, silicon, silicon oxide, silicon oxynitride, titanium oxide, and the like.

Figure 4:
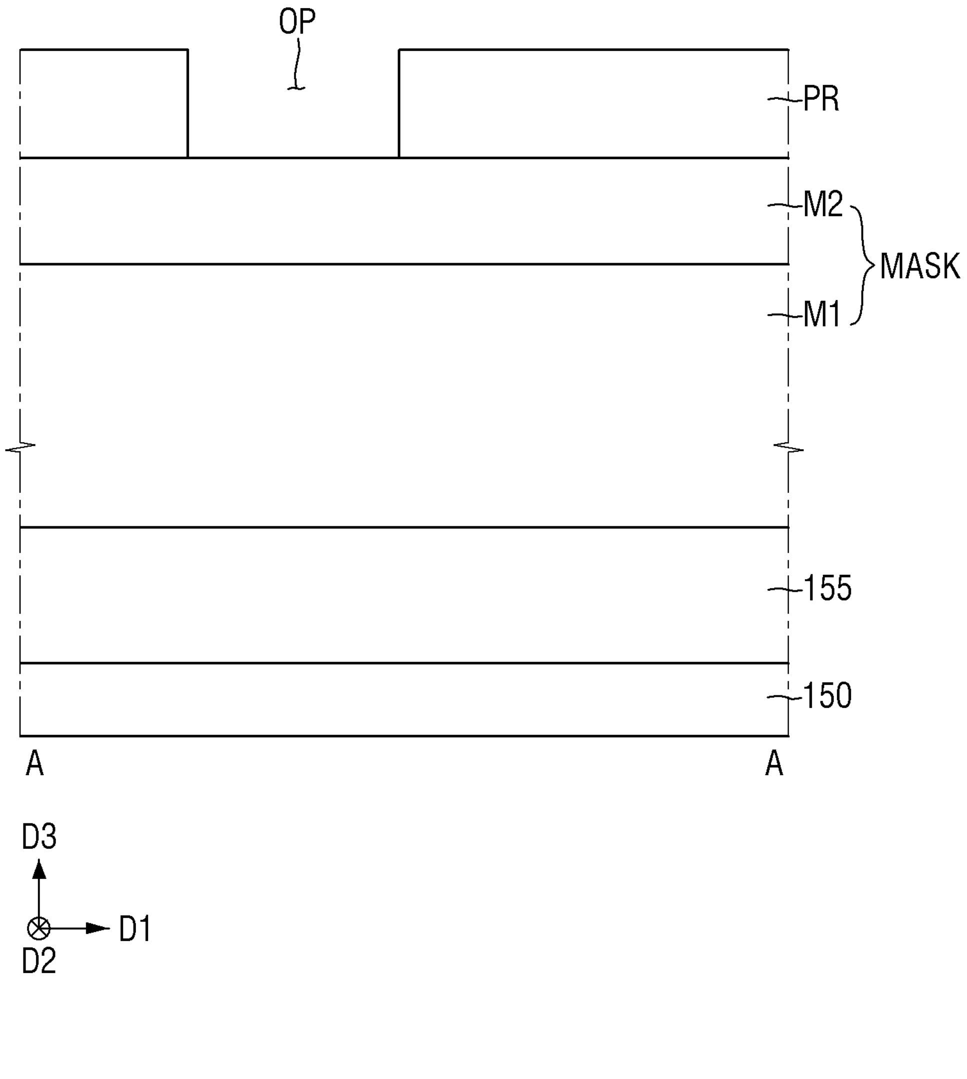
Figure 5:
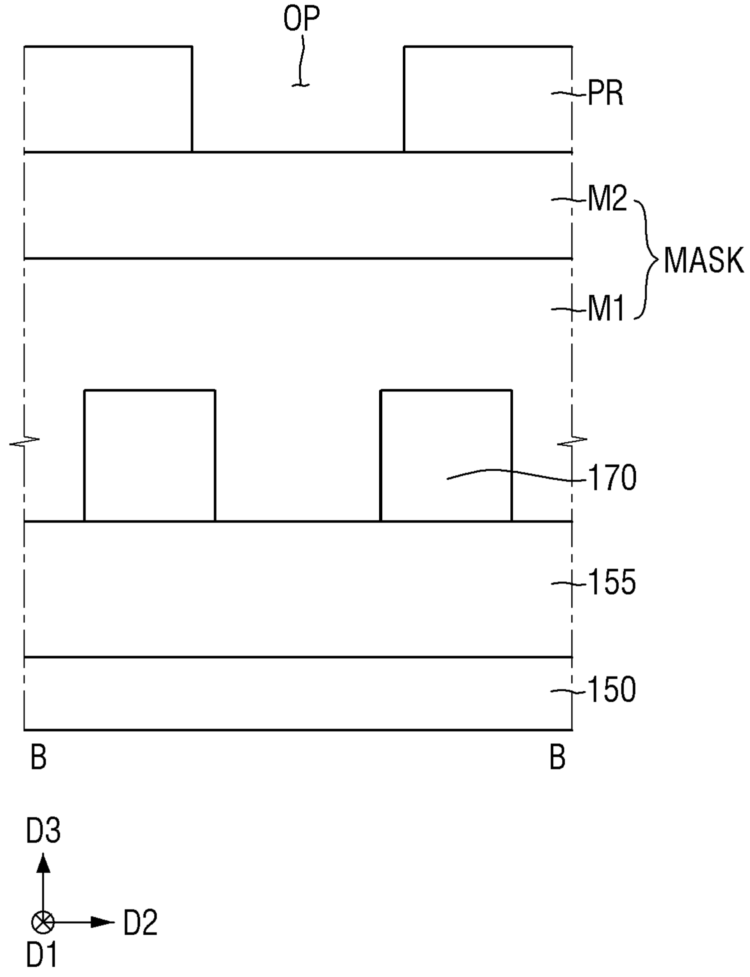

Referring to FIGS. 4 and 5, a mask layer MASK that is on and/or covers the second insulating film 155 and the line pattern 170 may be formed, and a photoresist pattern PR may be formed on the mask layer MASK.

Specifically, the mask layer MASK may include a first mask layer M1 and a second mask layer M2.

The first mask layer M1 may be on and/or cover the second insulating film 155 and the line pattern 170. The first mask layer M1 includes carbon. The first mask layer M1 may include, for example, an amorphous carbon layer (AMC). However, the embodiment is not limited thereto. As another example, the first mask layer M1 may include a polymer including carbon. The first mask layer M1 may be formed, for example, by a spin-on coating process.

A second mask layer M2 may be formed on the first mask layer M1. The first mask layer M1 may be between the second insulating film 155 and the second mask layer M2.

The second mask layer M2 may be a hard mask layer. The second mask layer M2 may include, for example, silicon, silicon oxide, silicon nitride, silicon oxynitride, and the like. The second mask layer M2 may not include carbon, unlike the first mask layer M1. However, the embodiment is not limited thereto.

Subsequently, a photoresist pattern PR may be formed on the mask layer MASK. Specifically, a photosensitive material may be applied onto the mask layer MASK. After that, an opening OP may be formed by patterning the photosensitive material, using a photo process. As a result, the photoresist pattern PR including the opening OP may be formed.

The opening OP may expose the upper surface of the second mask layer M2. The opening OP may be formed between adjacent line patterns 170 (e.g., an adjacent pair of line patterns 170). Specifically, the opening OP may overlap the mask layer MASK between the line patterns 170 in a third direction D3. Here, the third direction D3 is a direction orthogonal to the first direction D1 and the second direction D2. The third direction D3 may be a direction perpendicular to the upper surface of the first insulating film 150.

Although not shown, an antireflection film may be formed between the photoresist pattern PR and the mask layer MASK. The antireflection film may prevent total reflection of light in the photo process.

Figure 6:
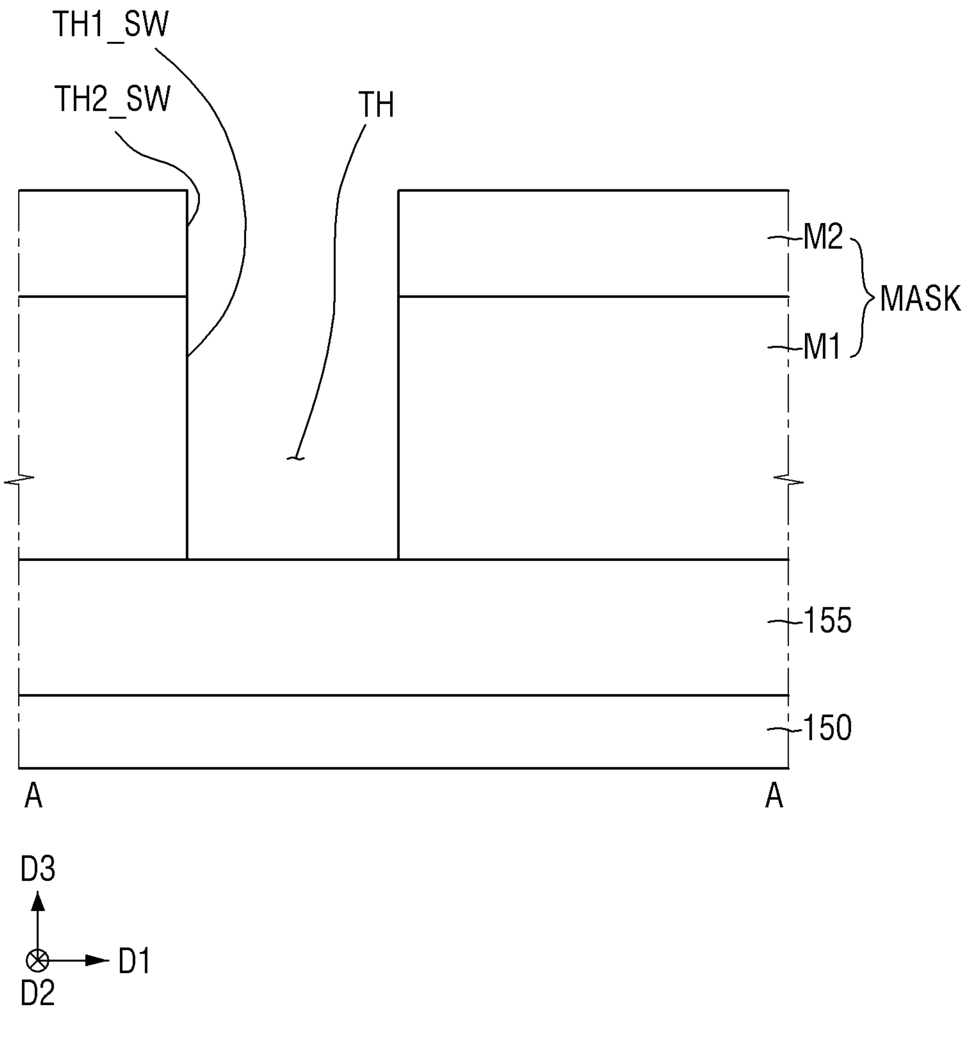
Figure 7:
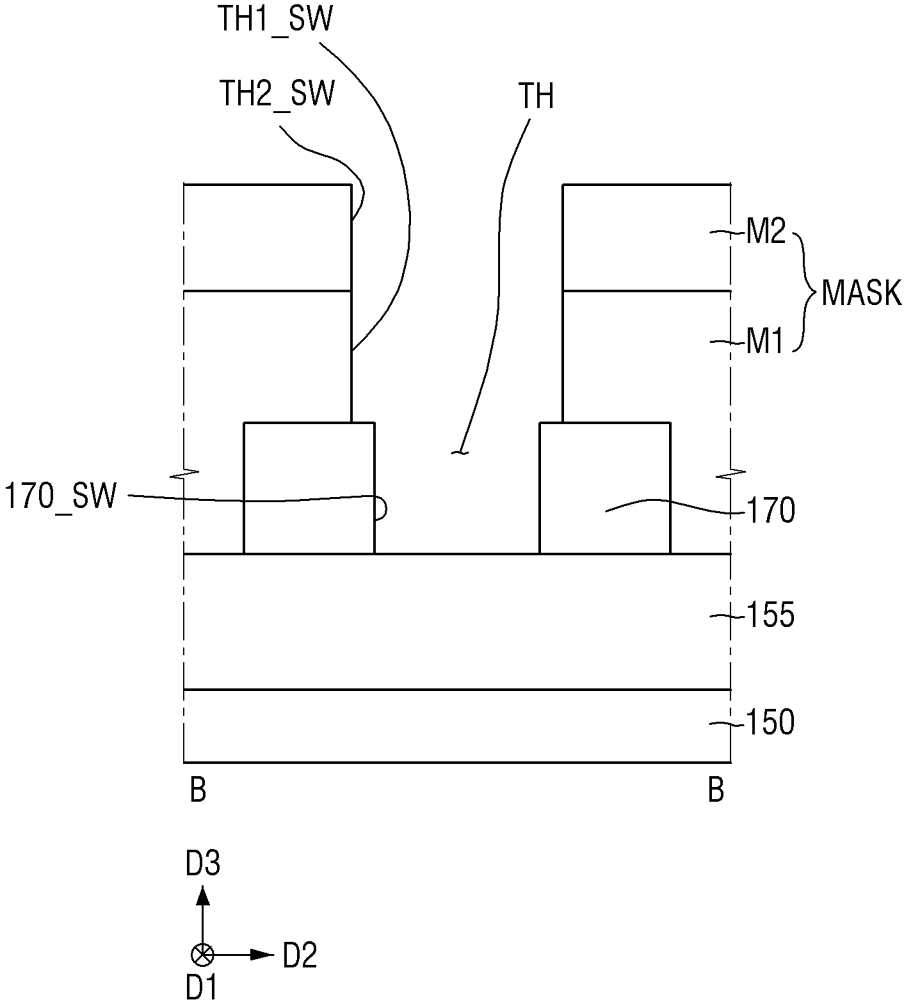

Referring to FIGS. 6 and 7, a through hole TH may be formed inside the mask layer MASK.

Specifically, the through hole TH may be formed by etching the mask layer MASK, using the photoresist pattern PR of FIG. 5 as an etching mask. The through hole TH may extend through the first mask layer M1 and the second mask layer M2. The through hole TH may expose the upper surface of the second insulating film 155. The through hole TH may expose a part of the upper surface of the line pattern 170 and a side wall 170_SW. Here, the side walls 170_SW of the line pattern 170 may face each other in the second direction D2.

The through hole TH may include a first portion TH1 formed in the first mask layer M1, and a second portion TH2 formed in the second mask layer M2. A part of the side wall TH1_SW of the first portion TH1 may be formed on the line pattern 170. That is, the line pattern 170 may not be removed during the process of forming the through hole TH.

Figure 8:
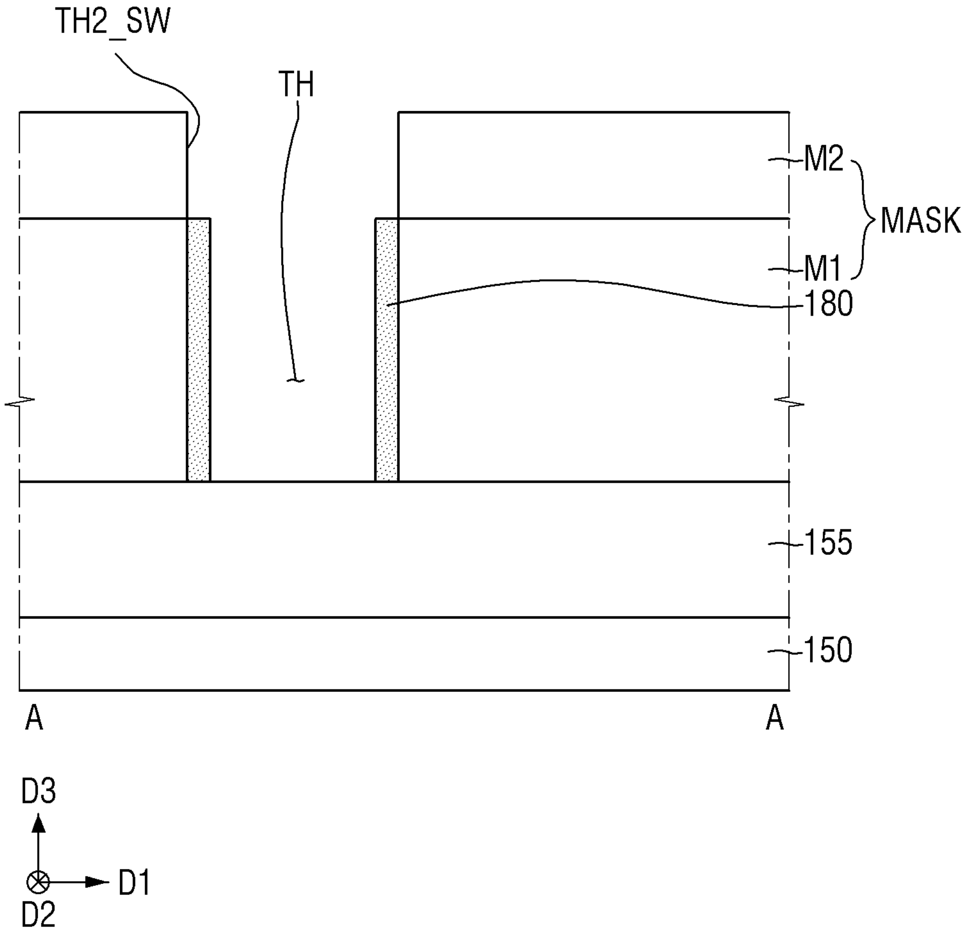
Figure 9:
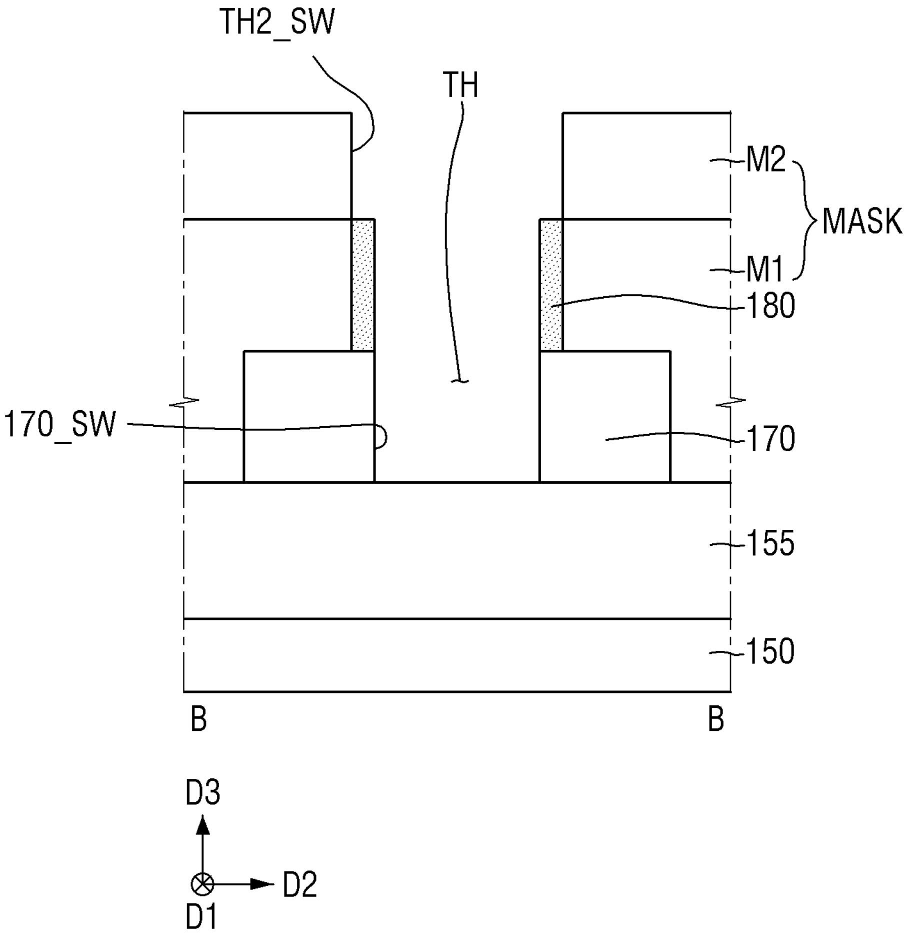

Referring to FIGS. 8 and 9, a liner layer 180 may be selectively formed on a part of the side walls of the through hole TH.

Specifically, the liner layer 180 may be formed on the side wall TH1_SW of the first portion TH1 of the through hole TH. The liner layer 180 may not be formed on the side wall TH2_SW of the second portion TH2 of the through hole TH. In other words, during a selective deposition process/method, the liner layer 180 may be formed on the portion in which the first mask layer M1 is exposed, and the liner layer 180 may not be formed on the portion in which the second mask layer M2 is exposed. The liner layer 180 may not be formed on the upper surface of the second mask layer M2. The liner layer 180 is not formed on side wall 170_SW of the line pattern 170. The liner layer 180 does not completely cover the upper surface of the second insulating film 155. That is, a part of the upper surface of the second insulating film 155 is exposed.

The liner layer 180 may include a material that is selectively formed on carbon. Since the first mask layer M1 includes carbon, the liner layer 180 may be formed on the first mask layer M1 by a selective deposition process. The liner layer 180 may be formed by deposition or growth on the first mask layer M1.

Since the liner layer 180 is formed on the first mask layer M1, the width of the through hole TH in the first direction D1 may decrease. That is, the width in the first direction D1 of the portion in which the upper surface of the second insulating film 155 is exposed may decrease.

Figure 10:
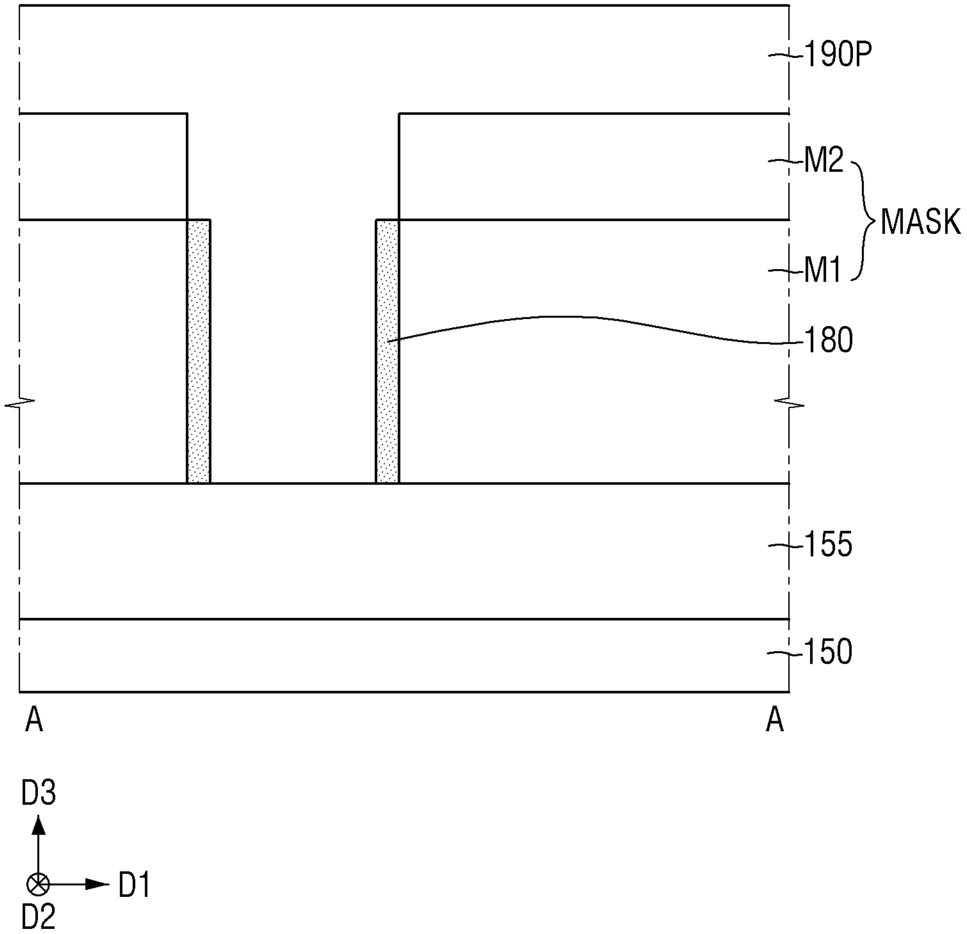
Figure 11:
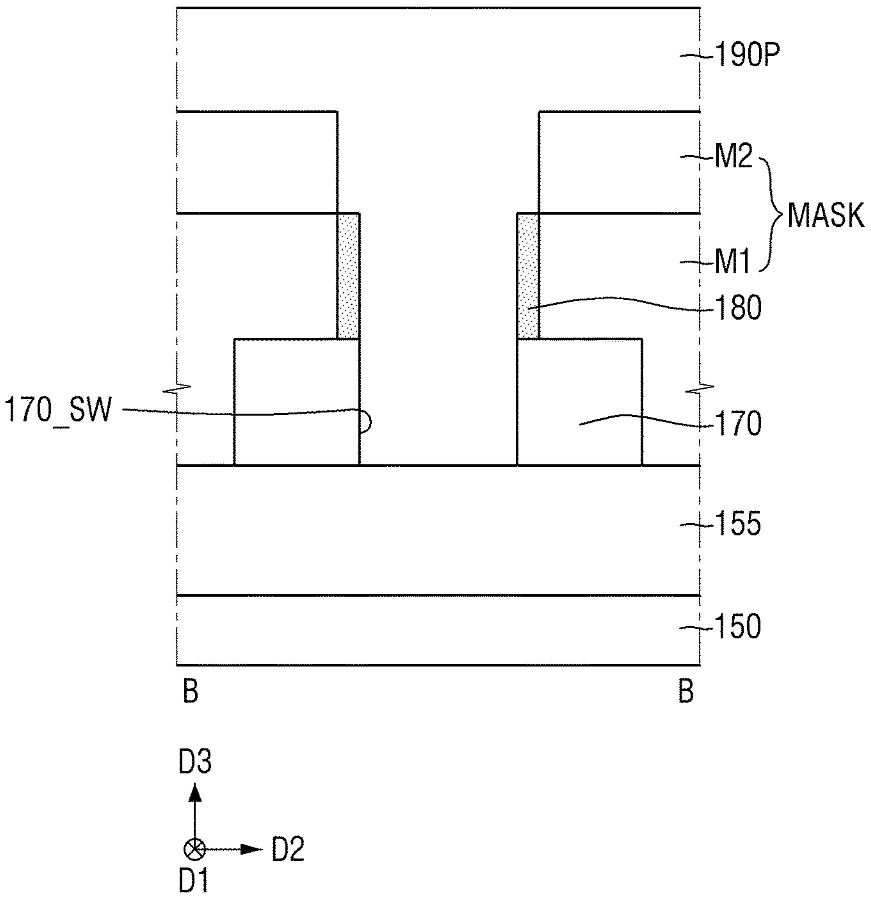

Referring to FIGS. 10 and 11, a pre-blocking pattern 190P may be formed on the second insulating film 155 and the mask layer MASK.

Specifically, the pre-blocking pattern 190P may be on and fill the through hole TH. A pre-blocking pattern 190P may be formed on the liner layer 180. The pre-blocking pattern 190P may cover the upper surface of the mask layer MASK.

The pre-blocking pattern 190P may be formed using, for example, an atomic layer deposition (ATOM) method, a chemical vapor deposition (CHD) method, or the like.

The pre-blocking pattern 190P may include a material having an etch selectivity with respect to the second mask layer M2. The pre-blocking pattern 190P may include, for example, titanium oxide or the like.

Figure 12:
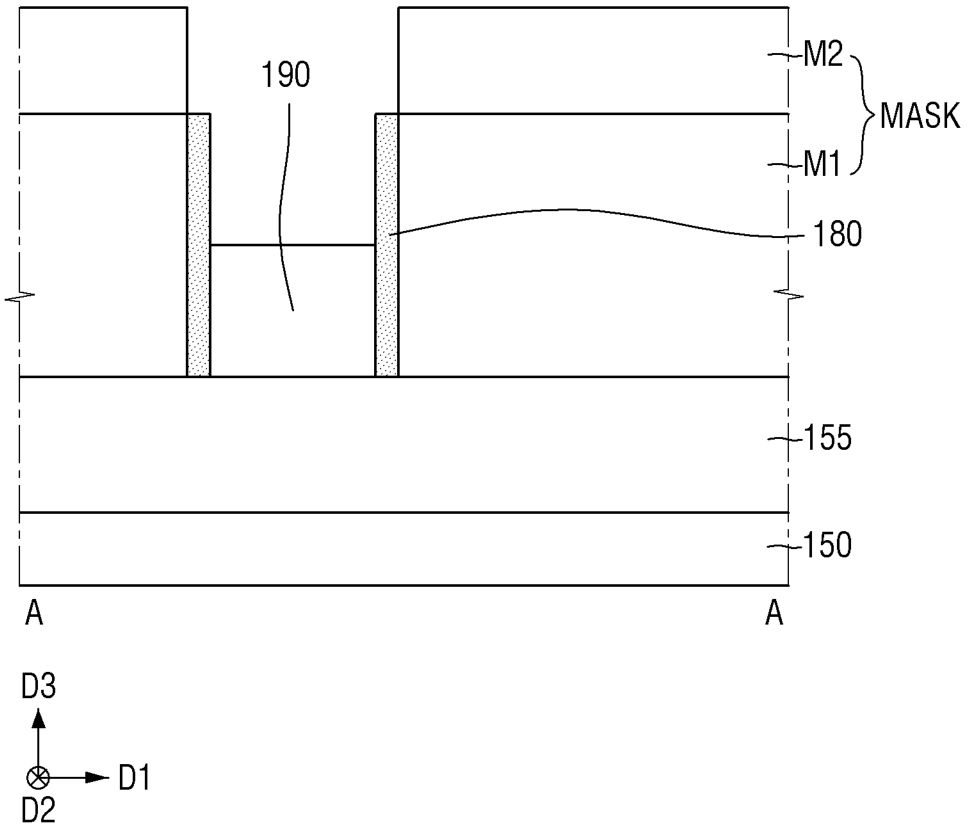
Figure 13:
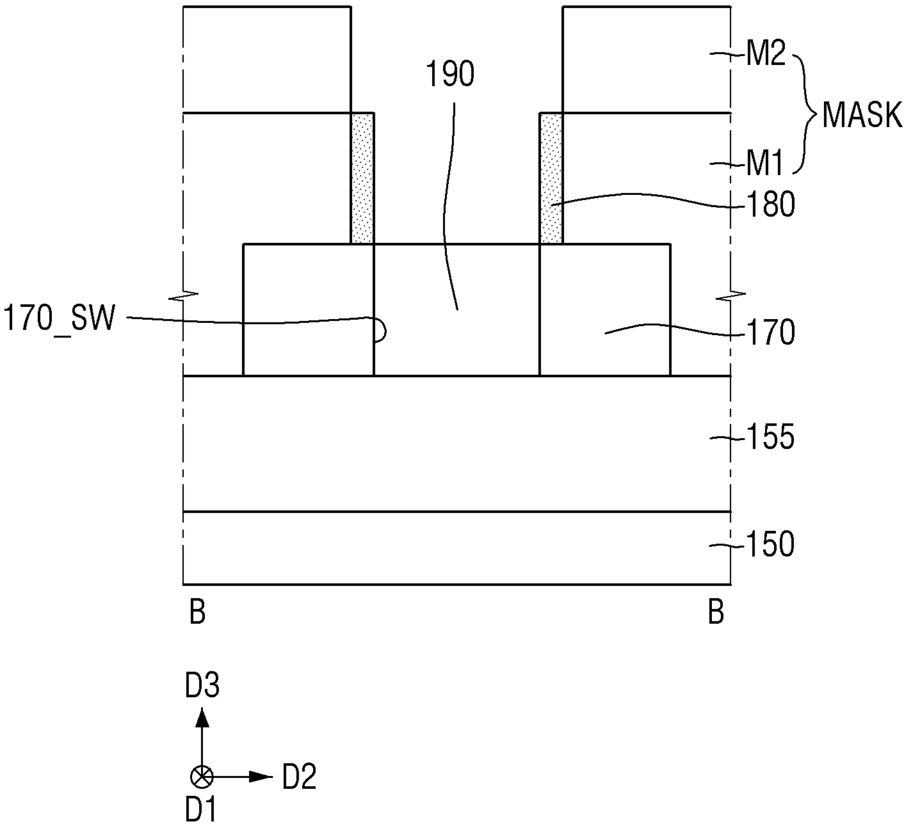
Figure 14:
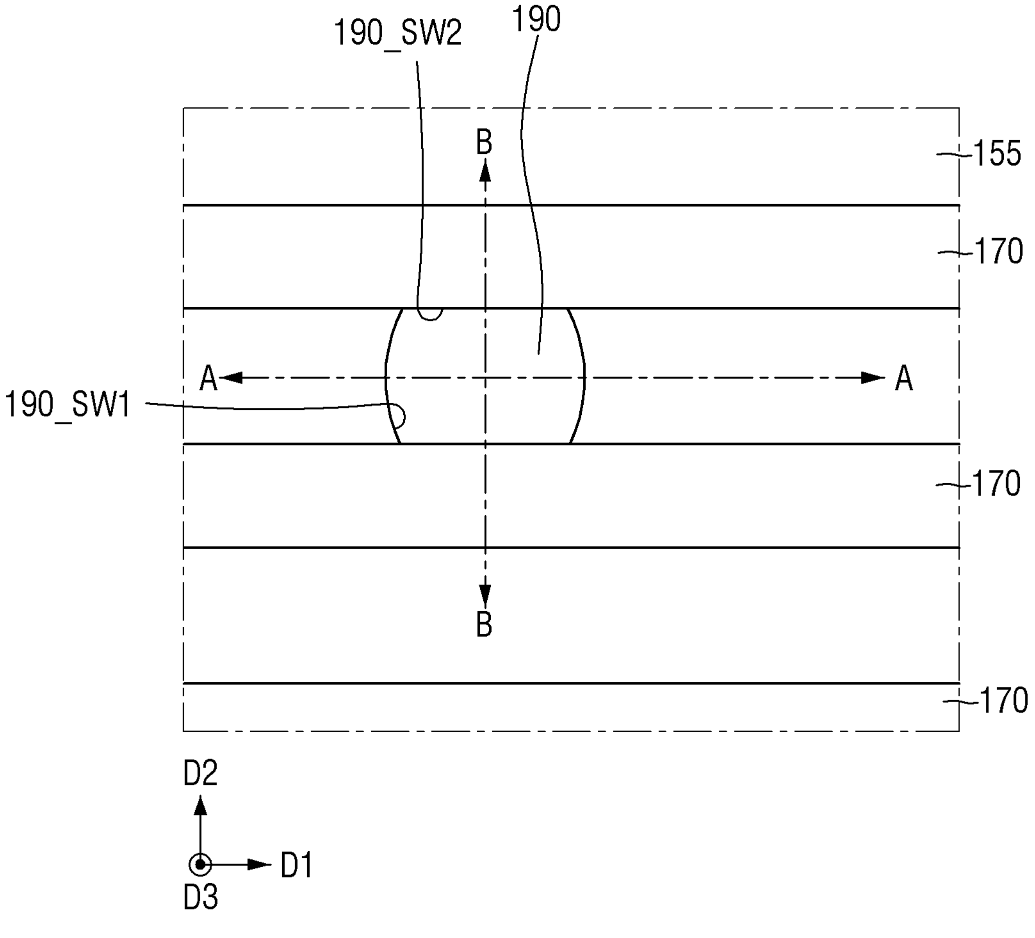

Referring to FIGS. 12 and 13, the pre-blocking pattern 190P may be etched to form the blocking pattern 190.

Specifically, the upper part of the pre-blocking pattern 190P may be etched, using an etch-back process. As a result, the blocking pattern 190 may be formed. The blocking pattern 190 may partially fill the through hole TH. The blocking pattern 190 may be formed on the upper surface of the second insulating film 155 and the liner layer 180.

Although the height of the blocking pattern 190 in the third direction D3 is shown as being the same as the height of the line pattern 170 in the third direction D3, the embodiment is not limited thereto. In the method for fabricating a semiconductor device according to some embodiments, the height of the blocking pattern 190 in the third direction D3 may be different from the height of the line pattern 170 in the third direction D3.

The blocking pattern 190 may be used as an etching mask in a wiring process. The blocking pattern 190 may be used to form a cut block that insulates wirings extending in the first direction D1.

As a size of the semiconductor device decreases, the size of wirings required for the wiring process also decreases. Such a decrease in wiring size may employ high precision for a position of the via that electrically connects the wiring layers together. In addition, it may be desirable to reduce the size of the blocking pattern that electrically insulates the wiring lines extending in one direction.

According to the method for fabricating the semiconductor device according to some embodiments, a width W1 of the blocking pattern 190 in the first direction D1 may be a distance between the liner layers 180 in the first direction D1. That is, the width W1 of the blocking pattern 190 may decrease compared to an embodiment where the liner layer 180 is not present. As a result, the width of the blocking pattern 190 decreases, and the size of the cut block formed using the blocking pattern 190 may decrease. Accordingly, misalignment of the connects the wiring layers together may decrease. Also, a contact area between the via and the wiring layer increases, and the element performance and reliability of the semiconductor device may be improved.

Referring to FIG. 14, the blocking pattern 190 may include first side walls 190_SW1 opposite to each other in the first direction D1, and second side walls 190_SW2 opposite to each other in the second direction D2. For reference, FIG. 14 is a plan view of FIGS. 12 and 13, and the mask layer MASK and the liner layer 180 are not shown for convenience of explanation.

The first side walls 190_SW1 of the blocking pattern 190 may include a convex portion from a planar point of view. However, the embodiment is not limited thereto. In the method for fabricating the semiconductor device according to some embodiments, the first side walls 190_SW1 of the blocking pattern 190 may be a straight line.

The second side walls 190_SW2 of the blocking pattern 190 contact the side walls 170_SW of the line pattern 170. The liner layer 180 is not formed between the second side wall 190_SW2 of the blocking pattern 190 and the side wall 170_SW of the line pattern 170.

Figure 15:
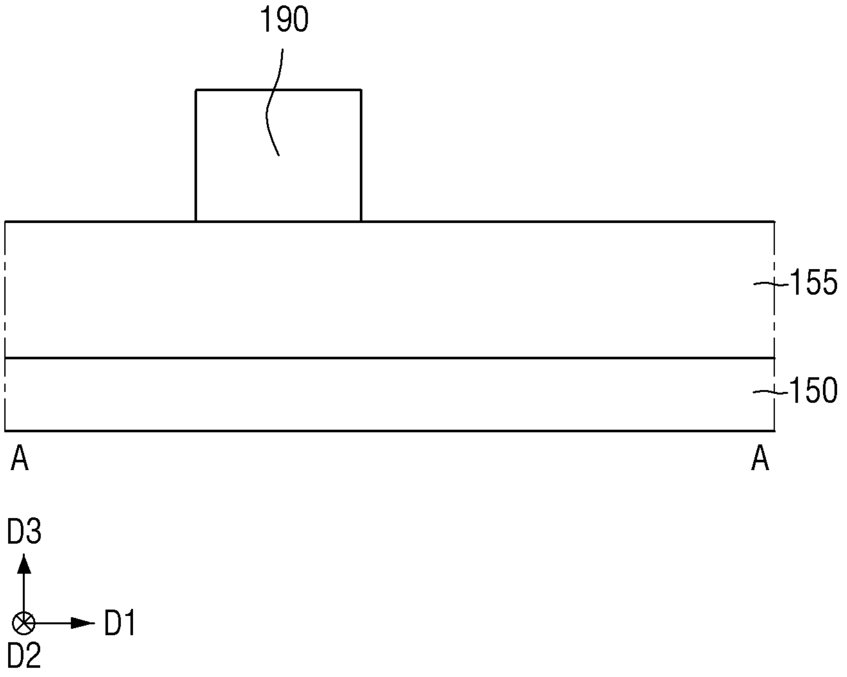
Figure 16:
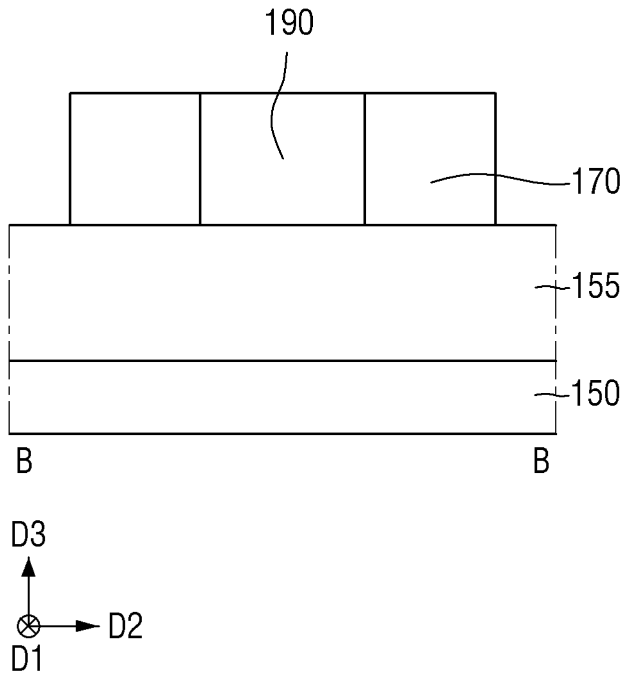

Referring to FIGS. 15 and 16, the mask layer MASK and the liner layer 180 are removed, and the blocking pattern 190 and the line pattern 170 may be exposed.

The mask layer MASK and the liner layer 180 may be removed, for example, by a dry etching process. For example, the mask layer MASK and the liner layer 180 may be removed using an ashing process. A part of the blocking pattern 190 may be removed while the ashing process is in progress. Specifically, a part of the first side wall SW1 of the blocking pattern 190 may be removed, and the convex portion of the first side wall SW1 may be removed.

Figure 17:
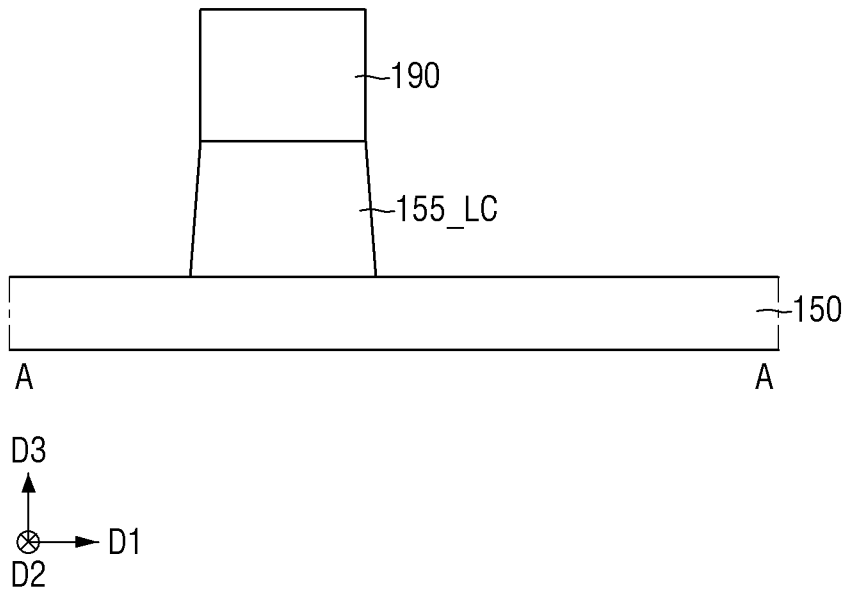

Referring to FIG. 17, a part of the second insulating film 155 may be removed to form a cutting pattern 155_LC.

Specifically, the second insulating film 155 may be patterned using the line pattern 170 and the blocking pattern 190 as etching masks. The cutting pattern 155_LC may be the second insulating film 155 patterned using the blocking pattern 190 as an etching mask.

Although a part of the second insulating film 155 is shown as being removed and the first insulating film 150 is shown as not being removed, the embodiment is not limited thereto. In the method for fabricating the semiconductor device according to some embodiments, some parts of the first insulating film 150 and the second insulating film 155 may be removed.

Figure 18:
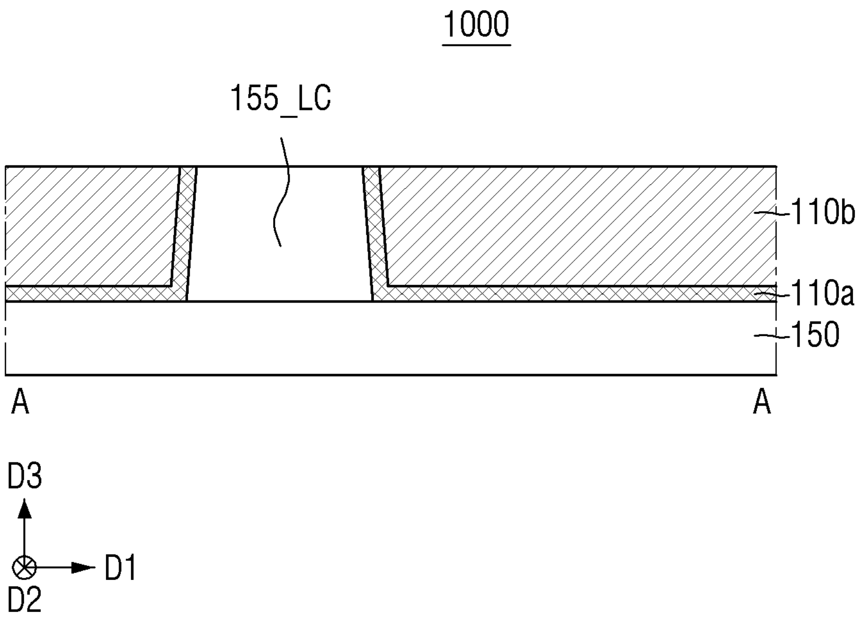

Referring to FIG. 18, a lower wiring 110 may be formed on the first insulating film 150.

The lower wiring 110 may include a lower wiring barrier film 110*a* and a lower wiring filling film 110*b*. The lower wiring barrier film 110*a* may be formed on the upper surface of the first insulating film 150 and the cutting pattern 155_LC. The lower wiring filling film 110*b* may be formed on the lower wiring barrier film 110*a*.

As shown, the lower wiring 110 may be separated in the first direction D1 by the cutting pattern 155_LC. The cutting pattern 155_LC may electrically isolate the lower wirings 110 adjacent to each other in the first direction D1.

The lower wiring 110 is electrically connected to a conductive pattern within the first insulating film 150. The conductive patterns in the first insulating film 150 may be, for example, a wiring pattern, a source/drain contact of transistor, a gate contact, and the like.

The lower wiring barrier film 110*a* may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and two-dimensional (2D) material. In the semiconductor device according to some embodiments, the two-dimensional material may be a metallic material and/or a semiconductor material. The 2D material may include a 2D allotrope or a 2D compound, and may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, since the above-mentioned 2D materials are only listed by way of example, the 2D materials that may be included in the semiconductor device of the present disclosure are not limited by the above-mentioned materials.

The lower wiring filling film 110*b* may include, for example, at least one of aluminum (Al), copper (Cu), tungsten (W), cobalt (Co), ruthenium (Ru), silver (Ag), gold (Au), manganese (Mn), molybdenum (Mo), rhodium (Rh), iridium (Ir), RuAl, NiAl, $NbB_2$, $MoB_2$, $TaB_2$, $V_2AlC$ and CrAlC. When the lower wiring filling film 110*b* includes copper (Cu), the lower wiring filling film 110*b* may include, for example, carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr) or the like.

FIGS. 19 to 22 illustrate another method for fabricating the semiconductor device according to some embodiments. For convenience of explanation, the same elements and/or description described above with reference to FIGS. 1 to 18 will be briefly explained.

Figure 19:
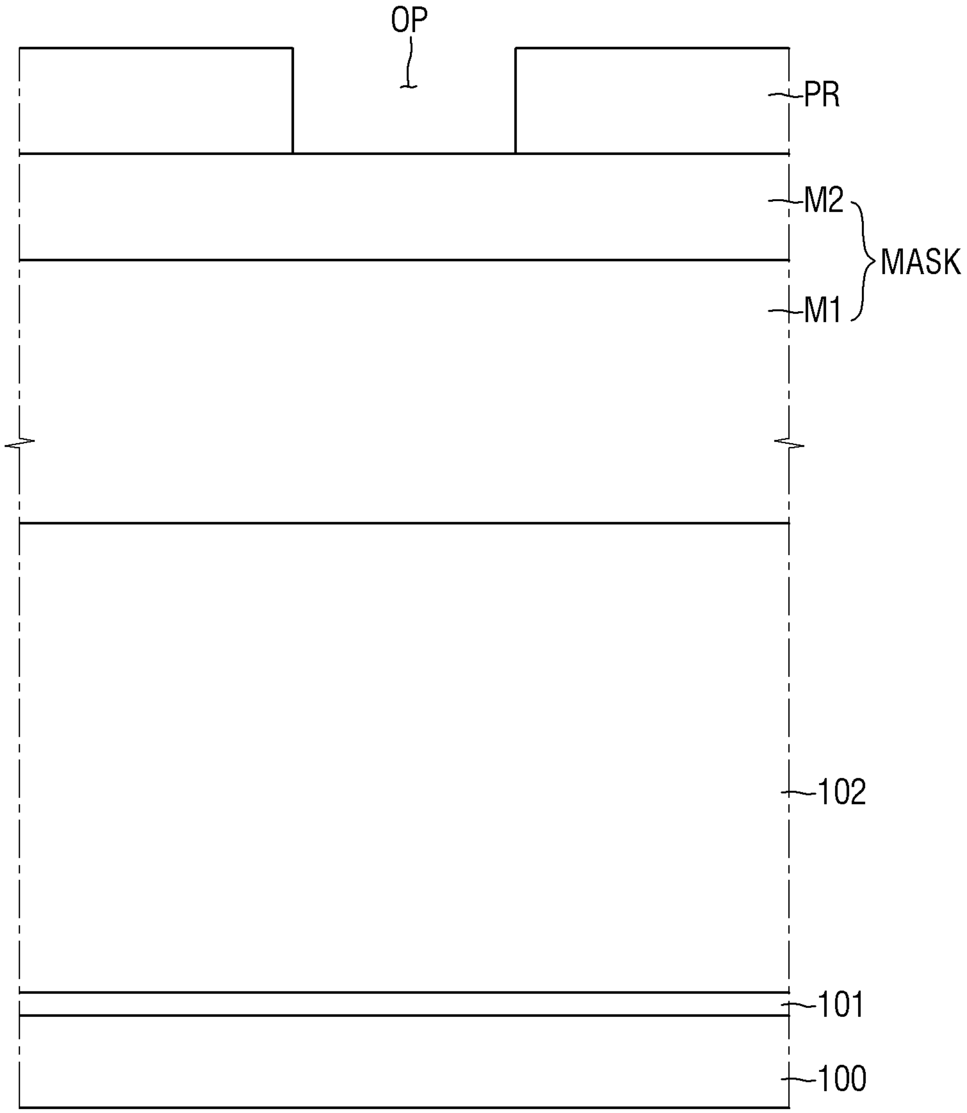
FIGS. 19, 20, 21, and 22 are illustrating a method for fabricating the semiconductor device according to some embodiments of the present disclosure.

Referring to FIG. 19, an etching stop film 101, a mold layer 102 and a mask layer MASK may be sequentially formed on the substrate 100.

The substrate 100 may be a silicon substrate or silicon-on-insulator (SOI). In contrast, the substrate 100 may include, but is not limited to, silicon germanium, silicon germanium on insulator (SGOI), indium antimonide, lead telluride, indium arsenide, indium phosphide, gallium arsenide or gallium antimonide.

The etching stop film 101 may be formed on the substrate 100. The etching stop film 101 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and combinations thereof. Although the first etching stop film 101 is shown as being a single film, the embodiment is not limited thereto. In one variation, the first etching stop film 101 may include a plurality of insulating films.

A mold layer 102 may be formed on the etching stop film 101. The mold layer 102 may be etched in a patterning process that uses the mask layer MASK. The mold layer 102 may be made up of, for example, a conductive layer, a dielectric layer, an insulating layer or a combination thereof. However, the embodiment is not limited thereto.

The mask layer MASK may be formed on the mold layer 102. The mask layer MASK may include a first mask layer M1 and a second mask layer M2. The description of the mask layer MASK is the same as the mask layer MASK described above with reference to FIGS. 1-18.

Subsequently, a photoresist pattern PR including the opening OP may be formed on the mask layer MASK. The opening OP may expose a part of the second mask layer M2.

Figure 20:
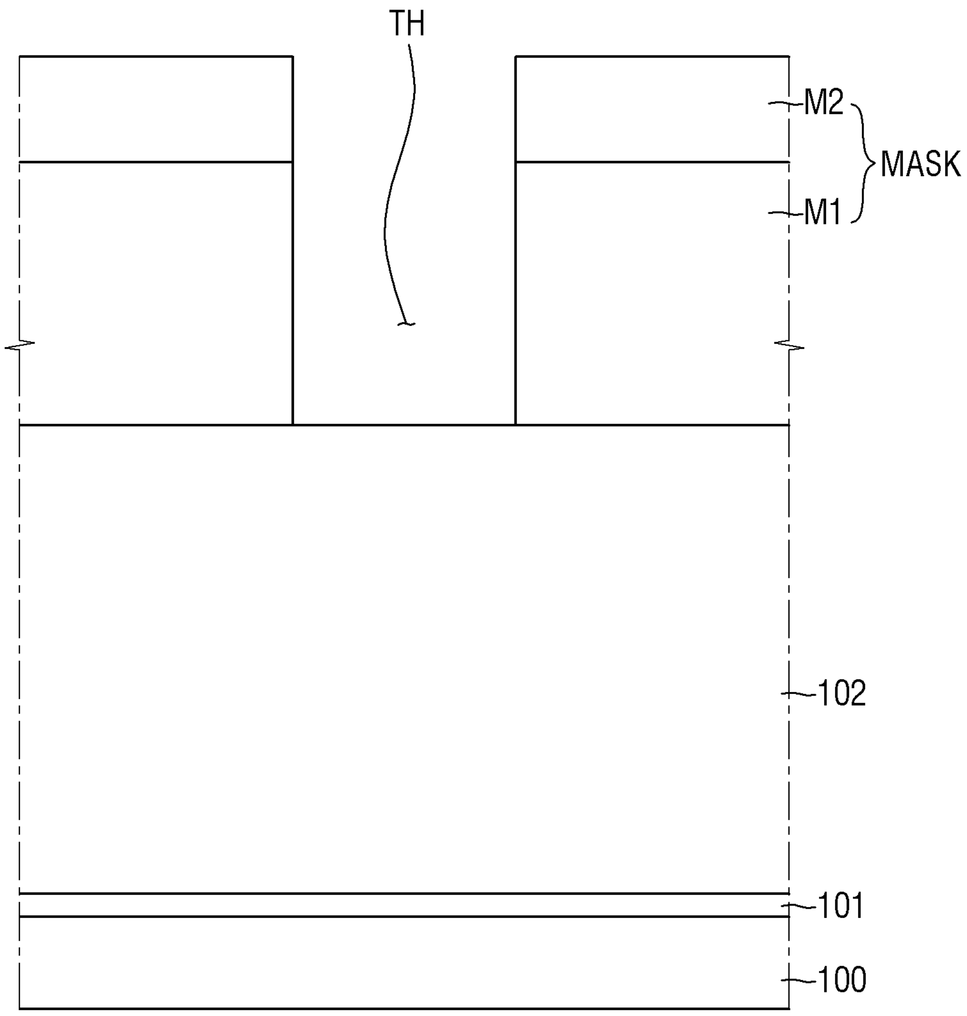

Referring to FIG. 20, the through hole TH may be formed within the mask layer MASK.

Specifically, the through hole TH may be formed by etching the mask layer MASK, using the photoresist pattern PR of FIG. 19 as an etching mask. The through hole TH may extend through the first mask layer M1 and the second mask layer M2. The through hole TH may expose the upper surface of the mold layer 102.

Figure 21:
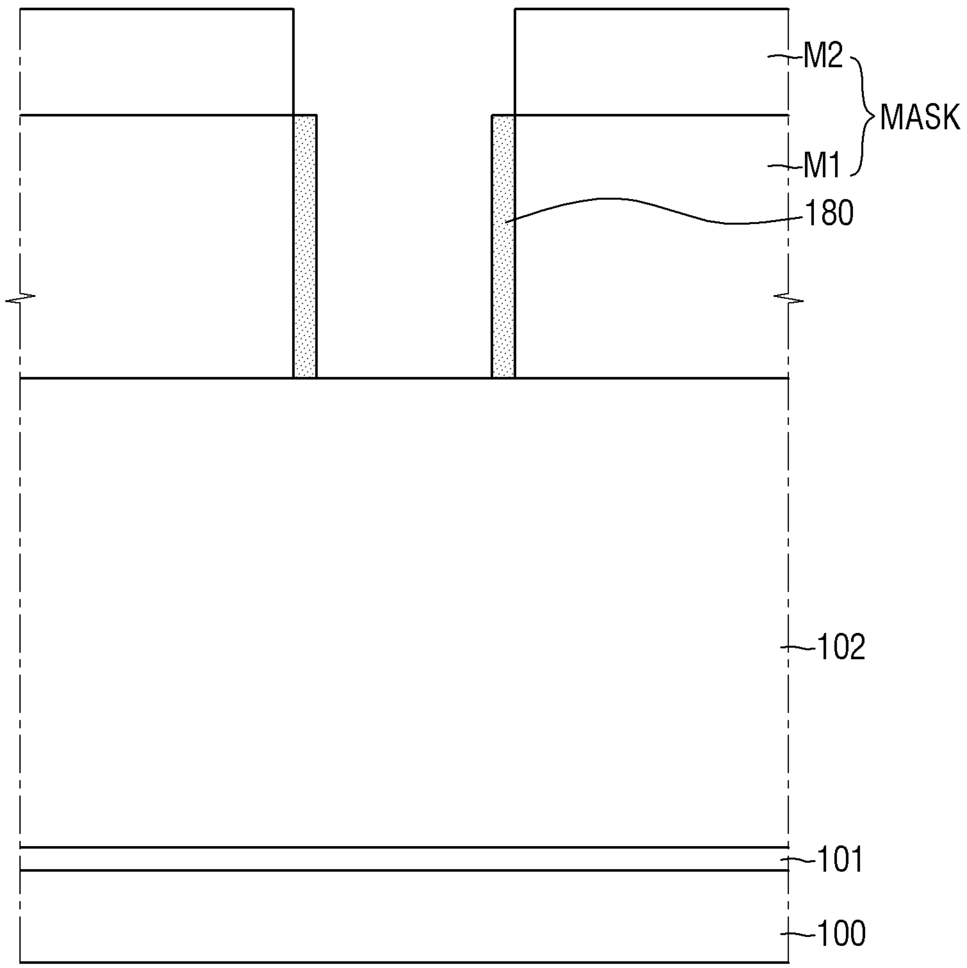

Referring to FIG. 21, the liner layer 180 may be selectively formed on a part of the side wall of the through hole TH.

Specifically, the liner layer 180 may be formed on the side wall TH1_SW of the first portion TH1 of the through hole TH. The liner layer 180 may not be formed on the side wall TH2_SW of the second portion TH2 of the through hole TH. In other words, the liner layer 180 may be formed in the portion in which the first mask layer M1 is exposed. The liner layer 180 may not be formed in the portion in which the second mask layer M2 is exposed. The liner layer 180 may not be formed on the upper surface of the second mask layer M2. The liner layer 180 does not completely cover the upper surface of mold layer 102. That is, a part of the upper surface of the mold layer 102 is exposed.

The liner layer 180 may include a material that is selectively formed on carbon. Since the first mask layer M1 includes carbon, the liner layer 180 may be formed on the first mask layer M1 by a selective deposition process. The liner layer 180 may be formed by depositing or growing on the first mask layer M1.

Since the liner layer 180 is formed on the first mask layer M1, the width of the through hole TH may decrease. Here, the width of the through hole TH may be a diameter of the through hole TH. In the method for fabricating the semiconductor device according to some embodiments, the width of the through hole TH may decrease compared to an embodiment where there is no liner layer 180. In other words, the size of the upper surface of the mold layer 102 exposed by the through hole TH may decrease by the liner layer 180.

Figure 22:
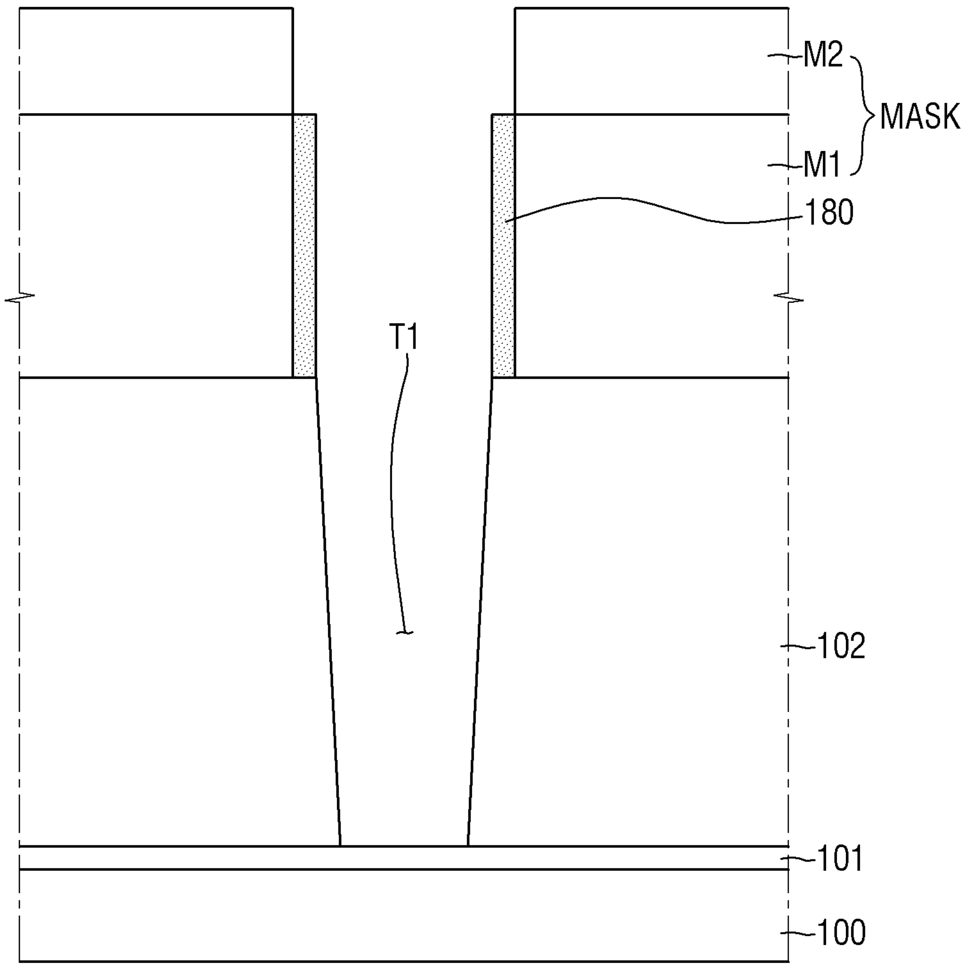

Referring to FIG. 22, the trench Tl may be formed within the mold layer 102.

Specifically, the trench Tl may be formed by etching the mold layer 102 using the mask layer MASK and the liner layer 180 as etching masks. The trench Tl may expose the etching stop film 101. The width of the trench Tl may decrease from the upper part to the lower part. However, the embodiment is not limited thereto.

Figure 23:
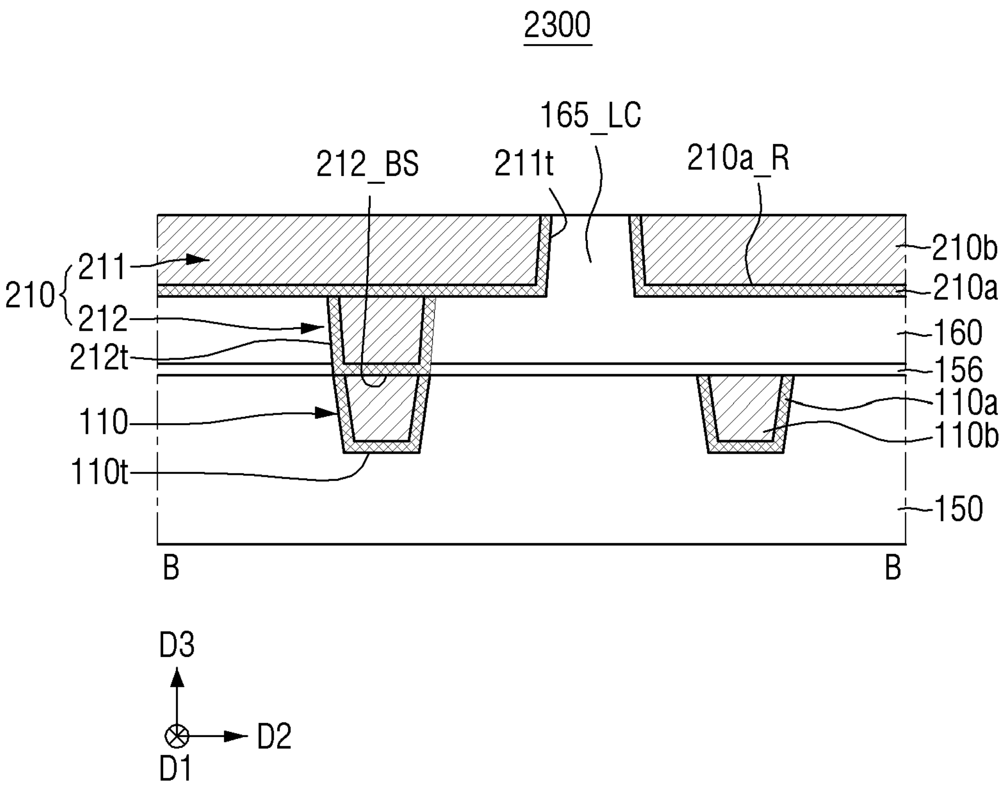
FIG. 23 is a diagram illustrating a semiconductor device according to some embodiments of the present disclosure.

FIG. 23 is a diagram illustrating an example semiconductor device 2300 according to some embodiments of the present disclosure.

Referring to FIG. 23, the semiconductor device 2300 may include a lower wiring 110, a first insulating film 150, an upper wiring structure 210, and a third insulating film 160.

The lower wiring 110 may be within the first insulating film 150. In some embodiments, the first insulating film 150 may be referred to as a "lower interlayer insulating film." The lower wiring 110 may extend in the first direction D1. The lower wiring 110 may have a line shape extending in the first direction D1.

As an example, the lower wiring 110 may be a contact or contact wiring formed in a middle-of-line (MOL) process. As another example, the lower wiring 110 may be a connection wiring formed in a back-end-of-line (BEOL) process of the lower wiring 110. In the following description, the lower wiring 110 refers to a connection wiring formed in the BEOL process.

The lower wiring 110 may include a lower wiring barrier film 110*a* and a lower wiring filling film 110*b*. The lower wiring filling film 110*b* may be on the lower wiring barrier film 110*a*. The lower wiring 110 may have a multi-film structure.

The lower wiring barrier film 110*a* may extend on side walls and a bottom surface of the lower wiring trench 110*t*. The lower wiring filling film 110*b* may fill the rest of the lower wiring trench 110*t*.

Although not shown, the cutting pattern 155_LC of FIG. 18 may be within the first insulating film 150. The cutting pattern 155_LC may separate the lower wiring 110 in the first direction D1. Although not shown, a via pattern may connect the lower wiring 110 and a conductive pattern placed the lower wiring 110.

A third insulating film 160 may be on the lower wiring 110 and the first insulating film 150. In some embodiments, the third insulating film 160 may be referred to as "an upper interlayer insulating film." The third insulating film 160 may include, for example, at least one of silicon oxide, silicon nitride, silicon oxynitride, and a low dielectric constant material.

An etching stop film 156 may be between the first insulating film 150 and the third insulating film 160. The etching stop film 156 may include a material having an etch selectivity with respect to the third insulating film 160.

The upper wiring trench 211*t* may extend in the second direction D2. A side wall of the upper wiring trench 211*t* may extend proximate to (i.e., near and/or adjacent) the upper surface of the third insulating film 160. The upper via hole 212*t* may be on the bottom surface of the upper wiring trench 211*t*.

The upper wiring structure 210 may be within each of the upper wiring trench 211*t* and the upper via hole 212*t*. The upper wiring structure 210 fills the upper wiring trench 211*t* and the upper via hole 212*t*. The upper wiring structure 210 may be within the third insulating film 160. The upper wiring structure 210 may include an upper wiring 211 and an upper via 212.

The upper wiring 211 may fill the upper wiring trench 211*t*. The upper via 212 may fill the upper via hole 212*t*. The upper wiring structure 210 may include an upper barrier conductive film 210*a* and an upper filling conductive film 210*b*. The upper filling conductive film 210*b* may be on the upper barrier conductive film 210*a*.

In some embodiments, the upper filling conductive film 210*b* of the upper via 212 may contact the upper barrier conductive film 210*a* of the upper wiring 211. In other words, the upper barrier conductive film 210*a* may be between the upper filling conductive film 210*b* of the upper via 212 and the upper filling conductive film 210*b* of the upper wiring 211.

The upper barrier conductive film 210*a* may extend on side walls and bottom surface of the upper wiring trench 211*t* and side walls and bottom surface of the upper via hole 212*t*. The upper fill conductive film 210*b* may fill a filling recess 210*a*_R defined by the upper barrier conductive film 210*a*.

The contents of the materials included in the upper barrier conductive film 210*a* and the upper filling conductive film 210*b* may be the same as those description of the lower wiring barrier film 110*a* and the lower wiring filling film 110*b*.

An upper cutting pattern 165_LC may be placed between the upper wirings 211. The upper cutting pattern 165_LC may electrically isolate the adjacent upper wirings 211. The upper cutting pattern 165_LC may be formed according to the fabricating method described in FIGS. 1 to 18.

Figure 24:
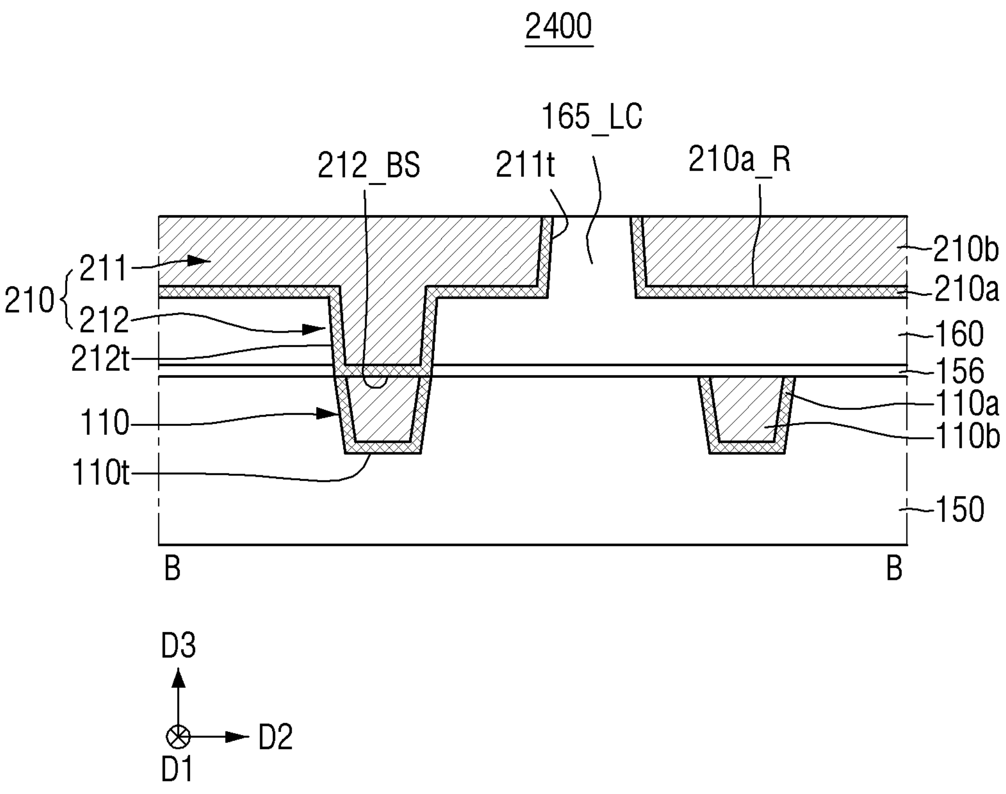
FIG. 24 is a diagram illustrating a semiconductor device according to some embodiments of the present disclosure.

FIG. 24 is a diagram of a semiconductor device 2400 according to some embodiments of the present disclosure.

Referring to FIG. 24, the upper wiring 211 may fill the upper wiring trench 211*t*. The upper via 212 may fill the upper via hole 212*t*. The upper wiring structure 210 may include an upper barrier conductive film 210*a* and an upper filling conductive film 210*b*.

The upper barrier conductive film 210*a* may be on the side walls and bottom surfaces of each of the upper wiring trench 211*t* and the upper via hole 212*t*. The upper filling conductive film 210*b* of the upper via 212 may contact the upper filling conductive film 210*b* of the upper wiring 211. The upper conductive filling film 210*b* of the upper wiring 211 and the upper conductive filling film 210*b* of the upper via 212 may contact each other.

Figure 25:
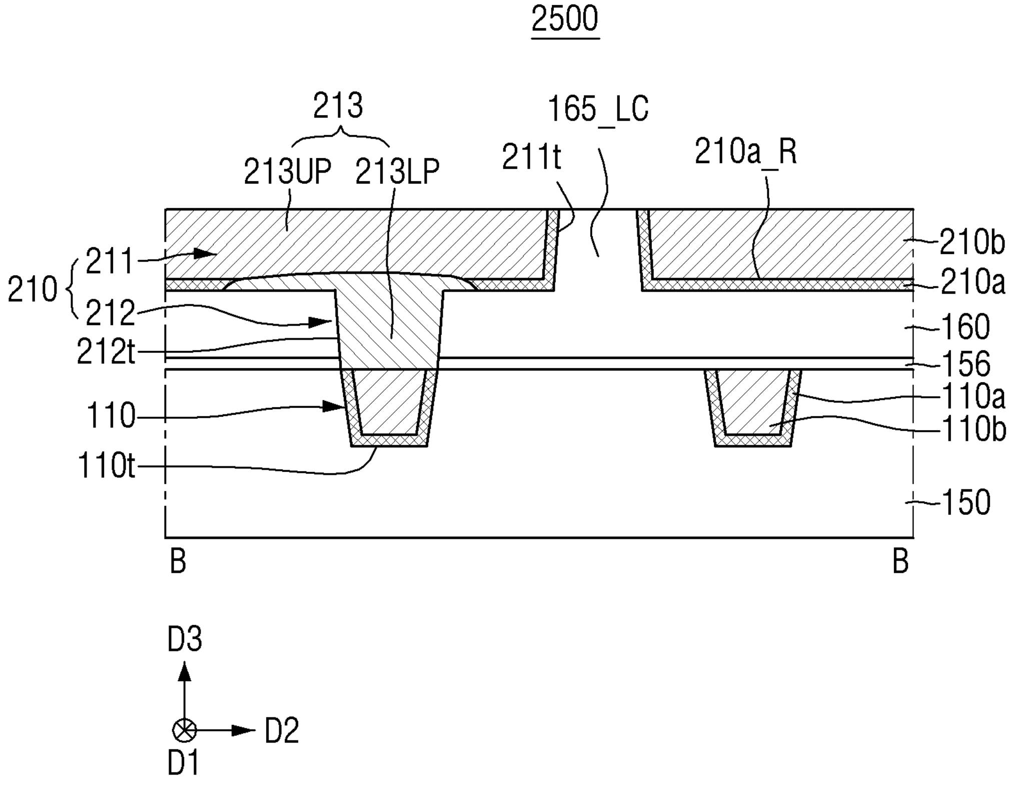
FIG. 25 is a diagram illustrating a semiconductor device according to some embodiments of the present disclosure.

FIG. 25 is a diagram of semiconductor device 2500 according to some embodiments.

Referring to FIG. 25, the semiconductor device 2500 may include a first sub-filling film 213LP that may fill the upper via hole 212*t*.

The upper barrier conductive film 210*a* may not be on the upper via hole 212*t*. That is, the first sub-filling film 213LP may be on side walls and a bottom surface of the upper via hole 212*t*. A part of the first sub-filling film 213LP may be placed on the bottom surface of the upper wiring trench 211*t*. However, the embodiment is not limited thereto. For example, the first sub-filling film 213LP may not be placed on the bottom surface of the upper wiring trench 211*t*.

The upper barrier conductive film 210*a* may be on side walls of the upper wiring trench 211*t*. The upper barrier conductive film 210*a* may be on the bottom surface of the upper wiring trench 211*t* in which the first sub-filling film 213LP is not placed.

A second sub-filling film 213UP may be on the first sub-filling film 213LP and the upper barrier conductive film 210*a*. The second sub-filling film 213UP may fill the remaining portion of the upper wiring trench 211*t* in which the first sub-filling film 213LP and the upper barrier conductive film 210*a* are placed. The second sub-filling film 213UP may contact the upper surface of the first sub-filling film 213LP.

The first sub-filling film 213LP may include, for example, a conductive material capable of selectively growing. The first sub-filling film 213LP may include, for example, one of titanium (Ti), tungsten (W), molybdenum (Mo), ruthenium (Ru), and cobalt (Co).

The first sub-filling film 213LP includes a material different from that of the second sub-filling film 213UP. The second sub-filling film 213UP may include, for example, at least one of aluminum (Al), copper (Cu), silver (Ag), gold (Au), manganese (Mn), rhodium (Rh), iridium (Ir), RuAl, NiAl, $NbB_2$, $MoB_2$, $TaB_2$, $V_2AlC$ and CrAlC.

Figure 26:
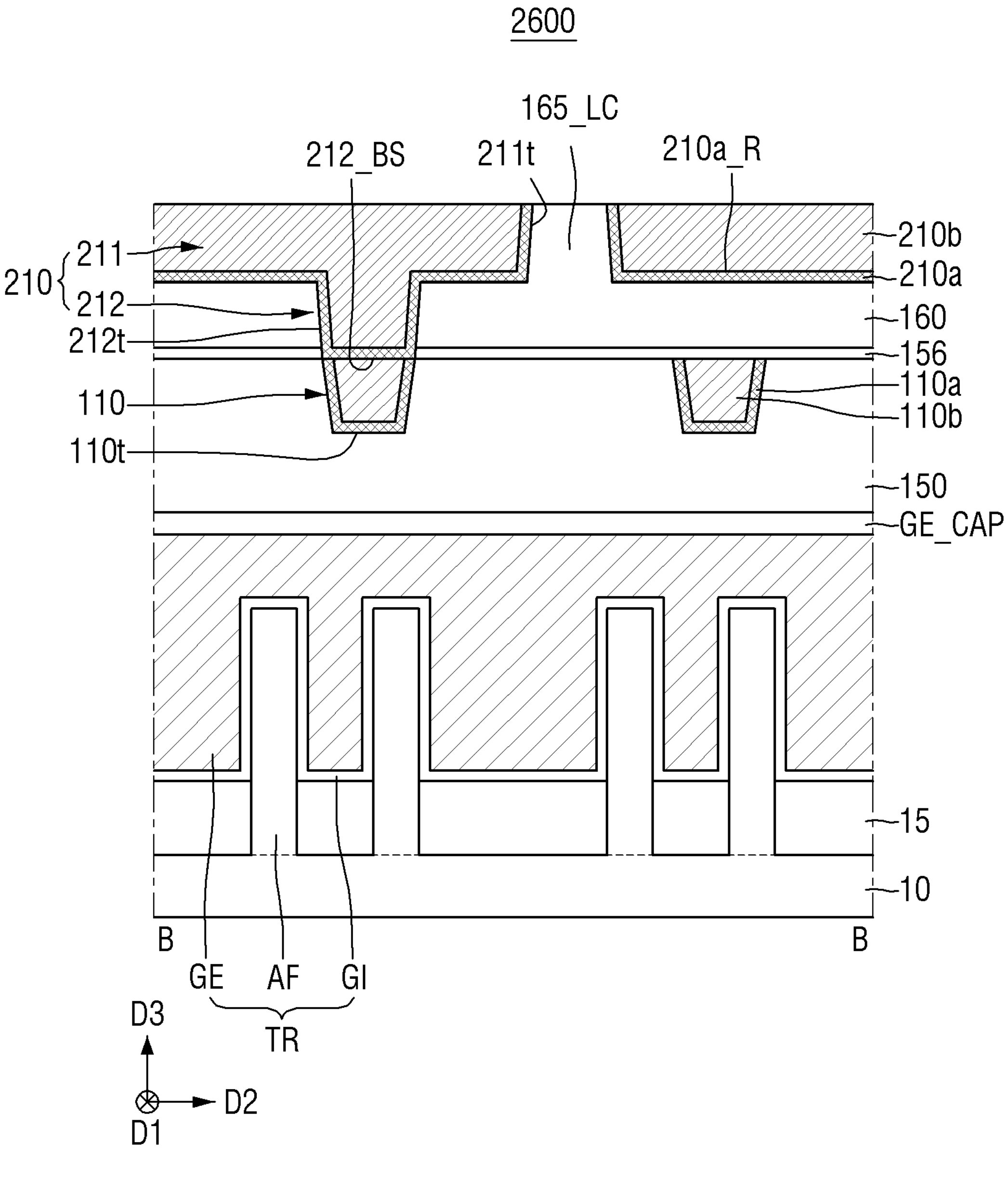
FIG. 26 is a diagram illustrating a semiconductor device according to some embodiment of the present disclosure s.

FIG. 26 is a diagram of semiconductor device 2600 according to some embodiments.

For reference, FIG. 26 is an exemplary diagram taken along the first gate electrode GE.

Although FIG. 26 shows that the fin-shaped pattern AF extends in the first direction D1 and the first gate electrode GE extends in the second direction D2, the present disclosure is not limited thereto.

Referring to FIG. 26, the semiconductor device according to some embodiments may include a transistor TR between the substrate 10 and the lower wirings 110 and 120.

The substrate 10 may be a silicon substrate or SOI. In other embodiments, the substrate 10 may include, but is not limited to, silicon germanium, SGOI, indium antimonide, lead telluride, indium arsenide, indium phosphide, gallium arsenide or gallium antimonide.

The transistor TR may include a fin-shaped pattern AF, a first gate electrode GE on the fin-shaped pattern AF, and a first gate insulating film GI between the first fin-shaped pattern AF and the first gate electrode GE.

Although not shown, the transistor TR may include source/drain patterns on both sides of the first gate electrode GE.

The fin-shaped pattern AF may extend from the substrate 10. The fin-shaped pattern AF may extend in the first direction D1. The fin-shaped pattern AF may be a part of the substrate 10, and may include an epitaxial layer grown from the substrate 10. The fin-shaped pattern AF may include, for example, silicon or germanium. Also, the fin-shaped pattern (AF) may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

A field insulating film 15 may be formed on the substrate 10. The field insulating film 15 may be formed on a part of the side walls of the fin-shaped pattern AF. The fin-shaped pattern AF may protrude upward from the upper surface of the field insulating film 15. The field insulating film 105 may include, for example, an oxide film, a nitride film, an oxynitride film or a combined film thereof.

The first gate electrode GE may be on the fin-shaped pattern AF. The first gate electrode GE may extend in the second direction D2. The first gate electrode GE may intersect the fin-shaped pattern AF.

The first gate electrode GE may include, for example, at least one of metal, conductive metal nitride, conductive metal carbonitride, conductive metal carbide, metal silicide, doped semiconductor material, conductive metal oxynitride, and conductive metal oxide.

The first gate insulating film GI may be between the first gate electrode GE and the fin-shaped pattern AF, and between the first gate electrode GE and the field insulating film 15. The first gate insulating film GI may include, for example, silicon oxide, silicon oxynitride, silicon nitride or a high dielectric constant material having a dielectric constant greater than that of silicon oxide. The high dielectric constant material may include, for example, at least one of boron nitride, metal oxide, and metal silicon oxide.

The semiconductor device according to some embodiments may include a negative capacitance (NC) FET that includes a negative capacitor. For example, the first gate insulating film GI may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of two or more capacitors connected in series has a negative capacitance value, the overall capacitances may be greater than an absolute value of each of the individual capacitances while having a positive value.

When the ferroelectric material film having the negative capacitance and the paraelectric material film having the positive capacitance are connected in series, the overall capacitance values of the ferroelectric material film and the paraelectric material film connected in series may increase. Due to the increased overall capacitance value, a transistor including the ferroelectric material film may have a subthreshold swing (SS) under 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary and may depend on the type of ferroelectric material that is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film differs from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material.

As an example, the first gate insulating film GI may include a single ferroelectric material film. As another example, the first gate insulating film GI may each include a plurality of ferroelectric material films spaced apart from each other. The first gate insulating film GI may have a stacked film structure in which the plurality of ferroelectric material films and the plurality of paraelectric material films are alternately stacked.

A gate capping pattern GE_CAP may be on the first gate electrode GE. The lower wirings 110 and 120 may be placed on the first gate electrode GE. Although the lower wirings 110 and 120 are shown as not being connected to the first gate electrode GE, the embodiment is not limited thereto. One of the lower wirings 110 and 120 may be connected to the first gate electrode GE.

Figure 27:
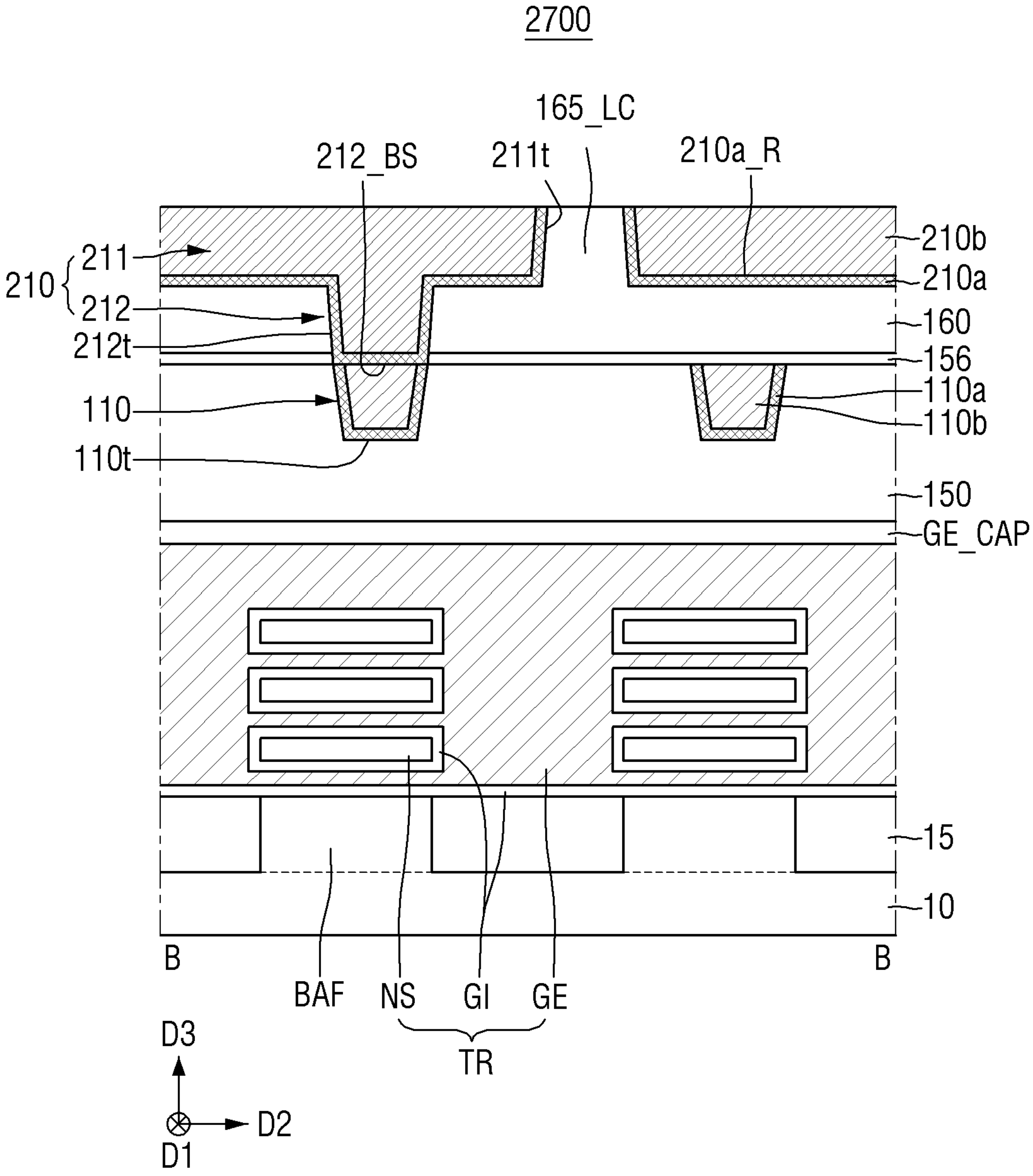
FIG. 27 is a diagram illustrating a semiconductor device according to some embodiments of the present disclosure.

FIG. 27 is a diagram of a semiconductor device 2700 according to some embodiments of the present disclosure.

Referring to FIG. 27, the semiconductor device 2700 may include a transistor TR, which may include a nanosheet NS, a first gate electrode GE that wraps the nanosheet NS, and a first gate insulating film GI between the nanosheet NS and the first gate electrode GE.

The nanosheet NS may be on the lower fin-shaped pattern BAF. The nanosheet NS may be spaced apart from the lower fin-shaped pattern BAF in the third direction D3. Although the transistor TR is shown to include three nanosheets NS spaced apart in the third direction D3, the embodiment is not limited thereto. That is, the number of nanosheets NS on the lower fin-shaped pattern BAF in the third direction D3 may be greater than or less than three.

The lower fin-shaped pattern BAF and the nanosheet NS may each include, for example, silicon or germanium. The lower fin-shaped pattern BAF and nanosheet NS may each include a compound semiconductor, and may include, for example, a group IV-IV compound semiconductor or a group III-V compound semiconductor. The lower fin-shaped pattern BAF and the nanosheet NS may include the same material or may include different materials.

Figure 28:
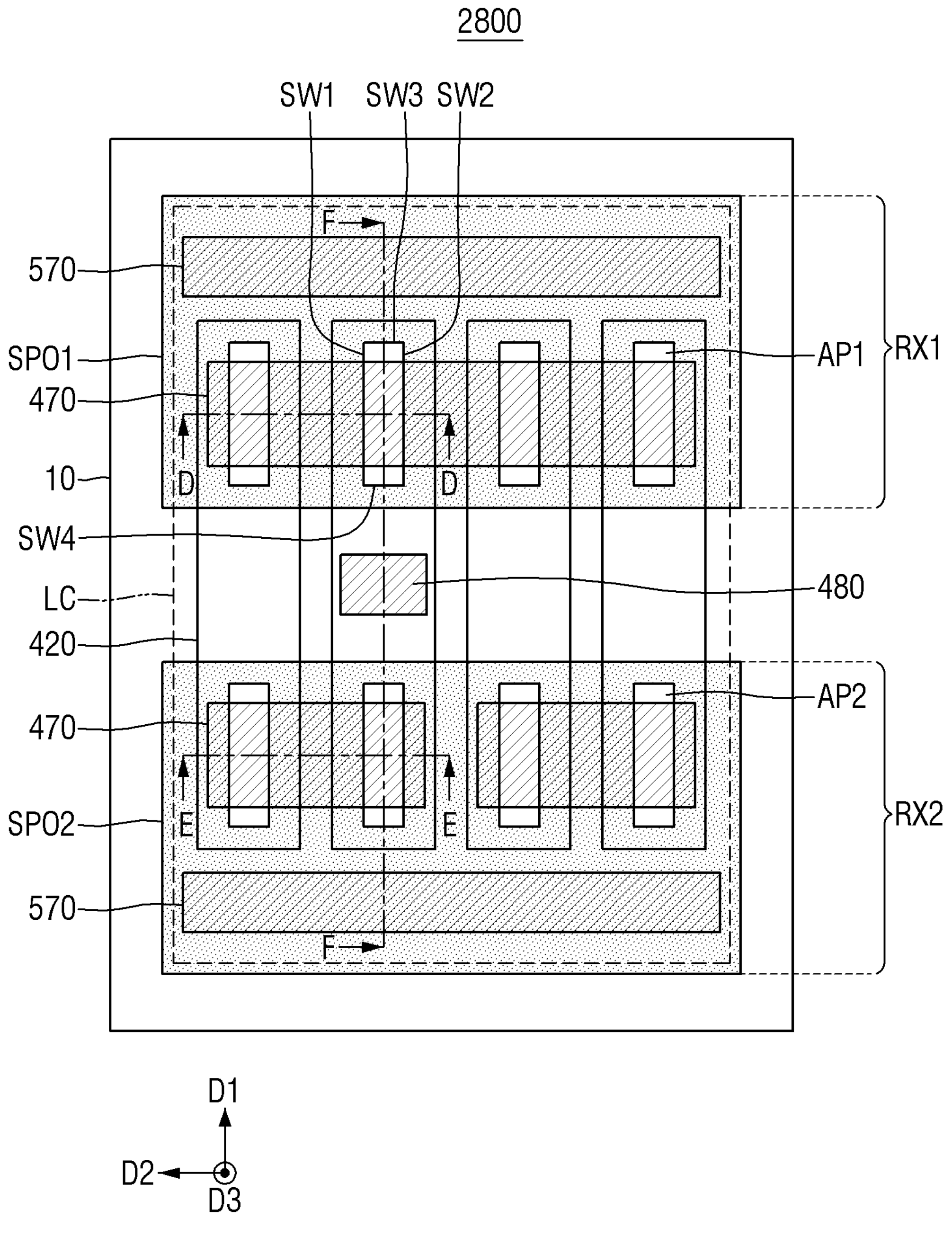
FIGS. 28, 29, and 30 are diagrams illustrating a semiconductor device according to some embodiments of the present disclosure.
Figure 29:
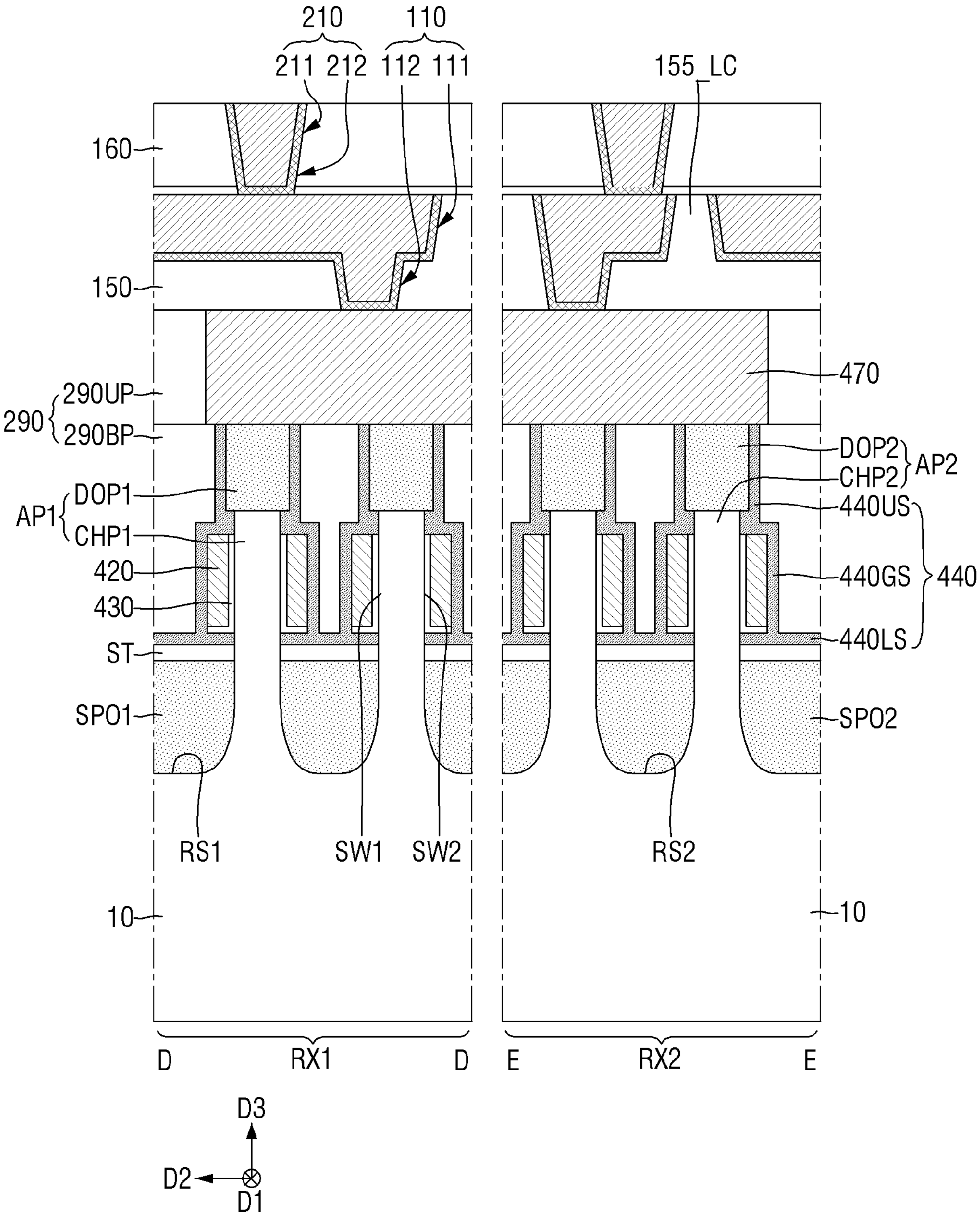
Figure 30:
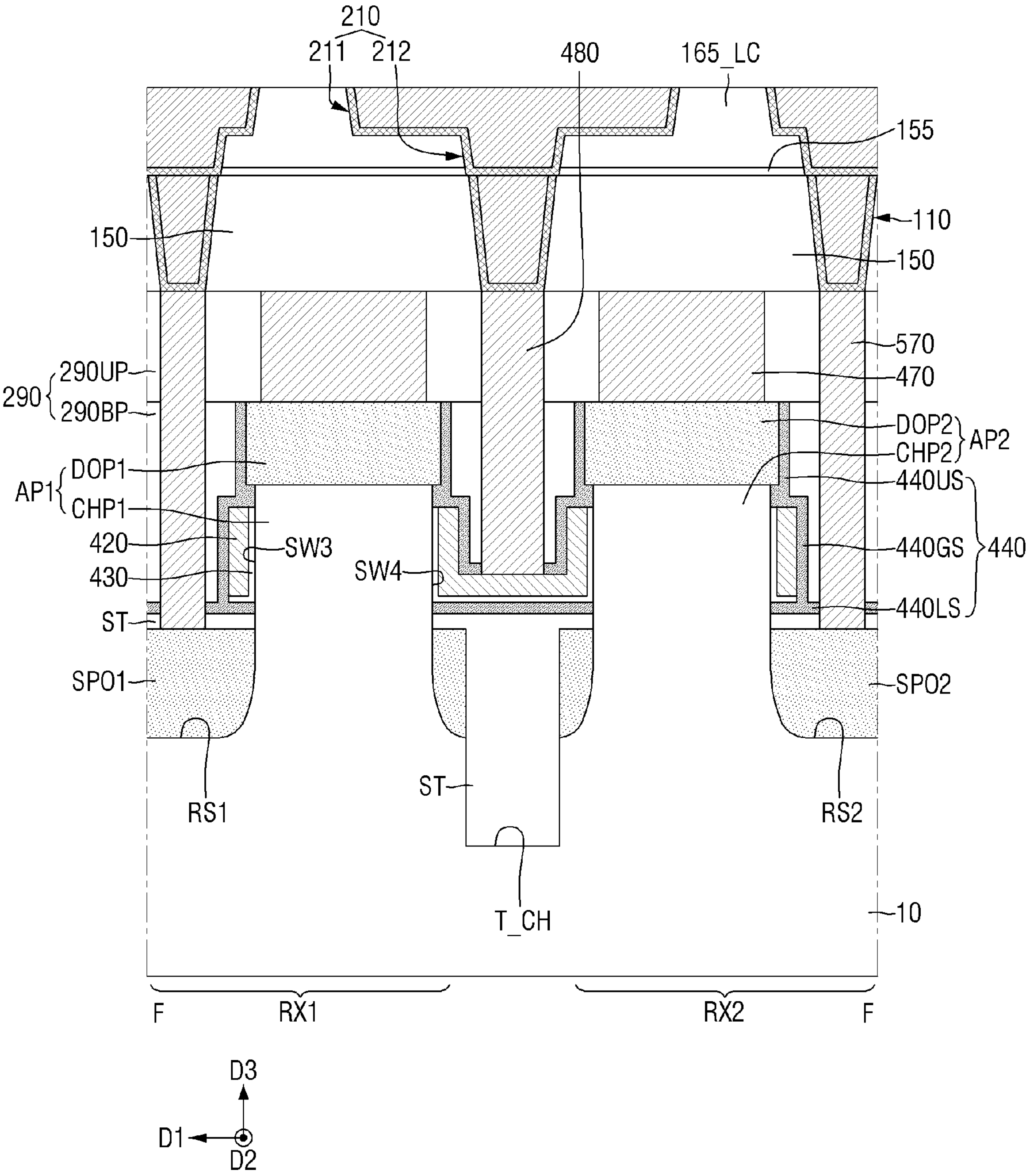

FIGS. 28 to 30 are diagrams of a semiconductor device 2800 according to some embodiments of the present disclosure. For reference, FIG. 28 is a plan view for explaining the semiconductor device 2800. FIG. 29 is a cross-sectional view taken along D-D and E-E of FIG. 28. FIG. 30 is a cross-sectional view taken along line F-F of FIG. 28.

Referring to FIGS. 28 to 30, a logic cell LC may be on the substrate 10. The logic cell LC may refer to a logic element (e.g., an inverter, a flip-flop, etc.) that performs specific functions. The logic cell LC may include vertical transistors (Vertical FET) that form a logic element and wirings that connect the vertical transistors to each other.

The logic cell LC on the substrate 10 may include a first active region RX1 and a second active region RX2. For example, the first active region RX1 may be a PMOSFET region, and the second active region RX2 may be an NMOSFET region. The first and second active regions RX1 and RX2 may be defined by a trench T_CH formed in the upper part of the substrate 10. The first and second active regions RX1 and RX2 may be spaced apart from each other in the first direction D1.

A first lower epi-pattern SOP1 may be on the first active region RX1, and a second lower epi-pattern SOP2 may be on the second active region RX2. In a planar view, the first lower epi-pattern SOP1 may overlap the first active region RX1, and the second lower epi-pattern SOP2 may overlap the second active region RX2. The first and second lower epitaxial patterns SOP1 and SOP2 may be epitaxial patterns formed by a selective epitaxial growth process. The first lower epi-pattern SOP1 may be within the first recess region RS1 of the substrate 10, and the second lower epi-pattern SOP2 may be within the second recess region RS2 of the substrate 10.

The first active patterns AP1 may be on the first active region RX1, and the second active patterns AP2 may be on the second active region RX2. Each of the first and second activity patterns AP1 and AP2 may have a fin shape that extends vertically. From a planar point of view, each of the first and second active patterns AP1 and AP2 may have a bar shape extending in the first direction D2. The first active patterns AP1 may be arranged along the second direction D2, and the second active patterns AP2 may be arranged along the second direction D2.

Each first active pattern AP1 may include a first channel pattern CHP1 vertically extending from the first lower epi-pattern SOP1, and a first upper epi-pattern DOP1 on the first channel pattern CHP1. Each second active pattern AP2 has a second channel pattern CHP2 vertically extending from the second lower epi-pattern SOP2, and a second upper epi-pattern DOP2 on the second channel pattern CHP2.

An element isolation film ST may be on the substrate 10 to fill the trench T_CH. The element isolation film ST may cover upper surfaces of the first and second lower epi-patterns SOP1 and SOP2. The first and second active patterns AP1 and AP2 may vertically extend above the element isolation film ST.

A plurality of second gate electrodes 420 extending parallel to each other in the first direction D1 may be on the element isolation film ST. The second gate electrodes 420 may be arranged along the second direction D2. The second gate electrode 420 may surround the first channel pattern CHP1 of the first active pattern AP1, and may surround the second channel pattern CHP2 of the second active pattern AP2. For example, the first channel pattern CHP1 of the first active pattern AP1 may have first to fourth side walls SW1 to SW4. The first and second side walls SW1 and SW2 may be opposite to each other in the second direction D2, and the third and fourth side walls SW3 and SW4 may be opposite to each other in the first direction D1. The second gate electrode 420 may be on the first to fourth side walls SW1 to SW4. In other words, the second gate electrode 420 may surround the first to fourth side walls SW1 to SW4.

A second gate insulating film 430 may be interposed between the second gate electrode 420 and each of the first and second channel patterns CHP1 and CHP2. The second gate insulating film 430 may cover the bottom surface of the second gate electrode 420 and inner side wall of the second gate electrode 420. For example, the second gate insulating film 430 may directly cover the first to fourth side walls SW1 to SW4 of the first active pattern AP1.

The first and second upper epi-patterns DOP1 and DOP2 may vertically extend above the second gate electrode 420. The upper surface of the second gate electrode 420 may be lower than the bottom surfaces of each of the first and second upper epi-patterns DOP1 and DOP2. In other words, each of the first and second active patterns AP1 and AP2 may have a structure that vertically extends from the substrate 10 and through the second gate electrode 420.

The semiconductor device according to some embodiments may include vertical transistors in which carriers move in the third direction D3. For example, when a voltage is applied to the second gate electrode 420 to turn “on” the transistor, the carriers may move from the lower epi-patterns SOP1 and SOP2 to the upper epi-patterns DOP1 and DOP2 through the channel patterns CHP1 and CHP2. In the semiconductor device according to some embodiments, the second gate electrode 420 may completely surround the side walls SW1 to SW4 of the channel patterns CHP1 and CHP2. A transistor according to the present disclosure may be a three-dimensional field effect transistor (e.g., VFET) having a gate-all-around structure. Because the gate surrounds the channel, the semiconductor device according to some embodiments may have excellent electrical properties.

A spacer 440 that covers the second gate electrodes 420 and the first and second active patterns AP1 and AP2 may be formed on the element isolation film ST. The spacer 440 may include a silicon nitride film or a silicon oxynitride film. The spacer 440 may include a lower spacer 440LS, an upper spacer 440US, and a gate spacer 440GS between the lower and upper spacers 440LS and 440US.

The lower spacer 440LS may directly cover the upper surface of the element isolation film ST. The second gate electrodes 420 may be spaced apart from the isolation layer ST in the third direction D3 by the lower spacer 440LS. The gate spacer 440GS may cover the upper surfaces and outer side walls of each of the second gate electrodes 420. The upper spacer 440 may cover the first and second upper epi-patterns DOP1 and DOP2. However, the upper spacer 440US may not cover the upper surfaces of the first and second upper epi-patterns DOP1 and DOP2, but may expose the upper surfaces of the first and second upper epi-patterns DOP1 and DOP2.

A first portion 290BP of the lower interlayer insulating film may be provided on the spacer 440. An upper surface of the first portion 290BP of the lower interlayer insulating film may be substantially coplanar with the upper surfaces of the first and second upper epi-patterns DOP1 and DOP2. A second portion 290UP of the lower interlayer insulating film and the first and third insulating films 150 and 160 may be sequentially stacked on the first portion 290BP of the lower interlayer insulating film. The first portion 290BP of the lower interlayer insulating film and the second portion 290UP of the lower interlayer insulating film may be included in the lower interlayer insulating film 290. The second portion 290UP of the lower interlayer insulating film may cover the upper surfaces of the first and second upper epi-patterns DOP1 and DOP2.

At least one first source/drain contact 470 extends through the second portion 290UP of the lower interlayer insulating film and is connected to the first and second upper epi-patterns DOP1 and DOP2. At least one second source/drain contact 570 sequentially extends through the lower interlayer insulating film 290, the lower spacer 440LS, and the element isolation film ST and is connected to the first and second lower epi-patterns SOP1 and SOP2. A gate contact 480 that sequentially extends through the second portion 290UP of the lower interlayer insulating film, the first portion 290BP of the lower interlayer insulating film, and the gate spacer 440GS and is connected to the second gate electrode 420.

A lower wiring 110 and a cutting pattern 155_LC may be within the first insulating film 150. The lower wiring 110 may include a via portion 112 and a wiring portion 111. The lower wiring 110 may be connected to the first source/drain contact 470, the second source/drain contact 570 and the gate contact 480. An upper wiring structure 210 and an upper cutting pattern 165_LC may be within the third insulating film 160.

In one variation, for example, an additional wiring structure similar to the upper wiring structure 210 may also be placed between the first source/drain contact 470 and the lower wiring 110.

In concluding the detailed description, those skilled in the art will appreciate that many variations and modifications may be made to the preferred embodiments without substantially departing from the principles of the present disclosure. Therefore, the disclosed preferred embodiments of the invention are used in a generic and descriptive sense only and not for purposes of limitation.

What is claimed is:

1. A method for fabricating a semiconductor device, the method comprising:

forming a mask layer on a substrate, the mask layer defining a through hole that exposes an upper surface of the substrate, the mask layer comprising a first mask layer and a second mask layer, wherein the second mask layer is between the substrate and the first mask layer, and wherein the second mask layer comprises carbon; and forming a liner layer on side walls of the through hole inside the second mask layer, wherein the liner layer is not on side walls of the through hole inside the first mask layer.

2. The method of claim 1, wherein:

the liner layer on the side walls of the through hole inside the second mask layer exposes the upper surface of the substrate, and the liner layer is not on an upper surface of the first mask layer and an upper surface of the second mask layer.

3. The method of claim 1, further comprising:

forming a trench within the substrate, using the mask layer and the liner layer as etching masks.

4. The method of claim 1, further comprising:

forming a blocking pattern on the upper surface of the substrate and on the liner layer to partially fill the through hole.

5. The method of claim 4, wherein forming the blocking pattern on the upper surface of the substrate and on the liner layer comprises:

forming an insulating material within the through hole and on an upper surface of the first mask layer; and etching the insulating material to expose the upper surface of the first mask layer.

6. The method of claim 5, wherein forming the insulating material comprises performing one of an atomic layer deposition process or a chemical vapor deposition process.

7. A method for fabricating a semiconductor device, the method comprising:

forming a pair of line patterns on an insulating film, wherein the pair of line patterns extend in a first direction;

forming a mask layer that defines a through hole that exposes an upper surface of the insulating film, wherein the through hole is between the pair of line patterns in a second direction;

forming a liner layer on a first portion of side walls of the through hole;

forming a blocking pattern in the through hole and on the liner layer; and removing, in response to forming the blocking pattern, the mask layer and the liner layer to expose the pair of line patterns.

8. The method of claim 7, wherein:

the mask layer comprises a first mask layer and a second mask layer, the first mask layer is between the insulating film and the second mask layer, and the first mask layer includes carbon.

9. The method of claim 8, wherein the first portion of the side walls is adjacent to the first mask layer, and wherein the liner layer is not on a second portion of the side walls of the through hole adjacent to the second mask layer.

10. The method of claim 7, wherein the through hole exposes a portion of the pair of line patterns.

11. The method of claim 10, wherein the liner layer is not on side walls of the pair of line patterns.

12. The method of claim 7, wherein the liner layer is not on the upper surface of the mask layer.

13. The method of claim 7, wherein forming the blocking pattern on the through hole and the liner layer further comprises:

forming an insulating material within the through hole and on the upper surface of the mask layer, and etching the insulating material to expose the upper surface of the mask layer.

14. The method of claim 13, wherein forming the insulating material comprises performing one of an atomic layer deposition process or a chemical vapor deposition process.

15. The method of claim 7, wherein removing the mask layer and the liner layer further comprises performing a dry etching process.

16. The method of claim 7, further comprising patterning, in response to removing the mask layer and the liner layer, the insulating film, using the blocking pattern and the pair of line patterns as etching masks.

17. The method of claim 7, wherein:

the blocking pattern includes first side walls, wherein each of the first side walls is opposite to each other in the first direction, and each of the first side walls comprises a convex portion.

18. The method for fabricating the semiconductor device of claim 7, wherein the blocking pattern includes second side walls, wherein each of the second side walls is opposite to each other in the second direction, and the second side walls contact the pair of line patterns.

19. The method for fabricating the semiconductor device of claim 7, wherein forming the mask layer further comprises:

sequentially forming a first mask layer and a second mask layer on the insulating film, forming a photoresist pattern that defines an opening on the second mask layer, and forming the through hole, using the photoresist pattern as an etching mask.

20. A method for fabricating a semiconductor device, the method comprising:

forming a second insulating film on a first insulating film that comprises a wiring pattern;

forming a plurality of line patterns on the second insulating film, wherein the plurality of line patterns extend in a first direction;

forming a first mask layer on the second insulating film and the plurality of line patterns, wherein the first mask layer comprises carbon;

forming a second mask layer on the first mask layer;

forming a photoresist pattern on the second mask layer, wherein the photoresist pattern defines an opening;

forming a through hole within the first mask layer and the second mask layer, using the photoresist pattern as an etching mask, wherein the through hole exposes the second insulating film;

forming a liner layer on a first mask layer and not on the second mask layer; and forming a blocking pattern on the liner layer to at least partially fill the through hole.

* * * * *